United States Patent [19]

Wakabayashi et al.

[11] Patent Number: 5,408,952
[45] Date of Patent: Apr. 25, 1995

[54] SINGLE CRYSTAL GROWTH METHOD

[75] Inventors: Daisuke Wakabayashi; Toshio Anbe; Masao Saitoh, all of Tokyo, Japan

[73] Assignees: Mitsubishi Materials Corporation; Mitsubishi Materials Silicon Corporation, both of Tokyo, Japan

[21] Appl. No.: 962,185

[22] PCT Filed: Dec. 27, 1991

[86] PCT No.: PCT/JP91/01790
  § 371 Date: Dec. 28, 1992
  § 102(e) Date: Dec. 28, 1992

[87] PCT Pub. No.: WO92/19797
  PCT Pub. Date: Nov. 12, 1992

[30] Foreign Application Priority Data

Apr. 26, 1991 [JP] Japan .................. 3-125444
Apr. 30, 1991 [JP] Japan .................. 3-99329
Jun. 10, 1991 [JP] Japan .................. 3-138048

[51] Int. Cl.6 .............................. C30B 15/26
[52] U.S. Cl. ...................... 117/201; 117/217; 117/218
[58] Field of Search .......... 156/601, 616.4, 617.1, 156/618.1, 619.1, 620.4, DIG. 80; 364/447; 422/249; 117/13, 38, 201, 202, 203, 208, 217, 218

[56] References Cited

U.S. PATENT DOCUMENTS

| | | | |
|---|---|---|---|
| 4,508,970 | 4/1985 | Ackerman | 156/601 |
| 4,565,598 | 1/1986 | Seymour | 156/601 |
| 4,660,149 | 4/1987 | Lissalde et al. | 364/477 |
| 4,794,263 | 12/1988 | Katsuoka et al. | 156/601 |
| 4,915,773 | 4/1990 | Kravetsky et al. | 156/617.1 |
| 4,926,357 | 5/1990 | Katsuoka et al. | 156/601 |
| 4,944,834 | 7/1990 | Tada et al. | 156/617.1 |
| 4,956,153 | 9/1990 | Yamagishi et al. | 156/617.1 |
| 5,089,238 | 2/1992 | Araki et al. | 422/249 |
| 5,096,677 | 3/1992 | Katsuoka et al. | 422/249 |

FOREIGN PATENT DOCUMENTS 54-082383 6/1979 Japan .
60-042294 3/1985 Japan .
60-071593 4/1985 Japan .
61-086493 5/1986 Japan .
63-002888 1/1988 Japan .
63-274687 11/1988 Japan .
1-128295 5/1989 Japan .
2-310451 12/1990 Japan .

*Primary Examiner*—R. Bruce Breneman
*Assistant Examiner*—FeLisa Garrett
*Attorney, Agent, or Firm*—Cushman, Darby & Cushman

[57] ABSTRACT

In the present invention a signal is caused to fall on the molten liquid surface of single crystal raw material which was put into a crucible, the position of the molten liquid surface is measured by detecting the reflected signal coming from the molten liquid surface and the crucible is lifted according to the discrepancy to the set value.

5 Claims, 22 Drawing Sheets

DATA ON QUALITY CORRESPONDING
TO LIFT DISTANCE AND AVERAGE AND
STANDARD DEFLECTION GRAPH

DATA ON QUALITY CORRESPONDING
TO LIFT DISTANCE AND AVERAGE AND
STANDARD DEFLECTION GRAPH

FIG.20

PARAMETER TOLERANCE CHANGE RATIOS

1. SEED LIFTING SEED-SHOULDER PROCESS (+) (%) : 20
2. SEED LIFTING SEED-SHOULDER PROCESS (-) (%) : 20
4. SEED LIFTING SEED-TRUNK PROCESS (%) : 20
4. SEED ROTATION SPEED (%) : 20
5. CRUCIBLE ROTATION SPEED (%) : 20
6. HEATER TEMPERATURE (%) : 20
7. FURNACE PRESSURE (%) : 20
8. ARGON DISCHARGE (%) : 20

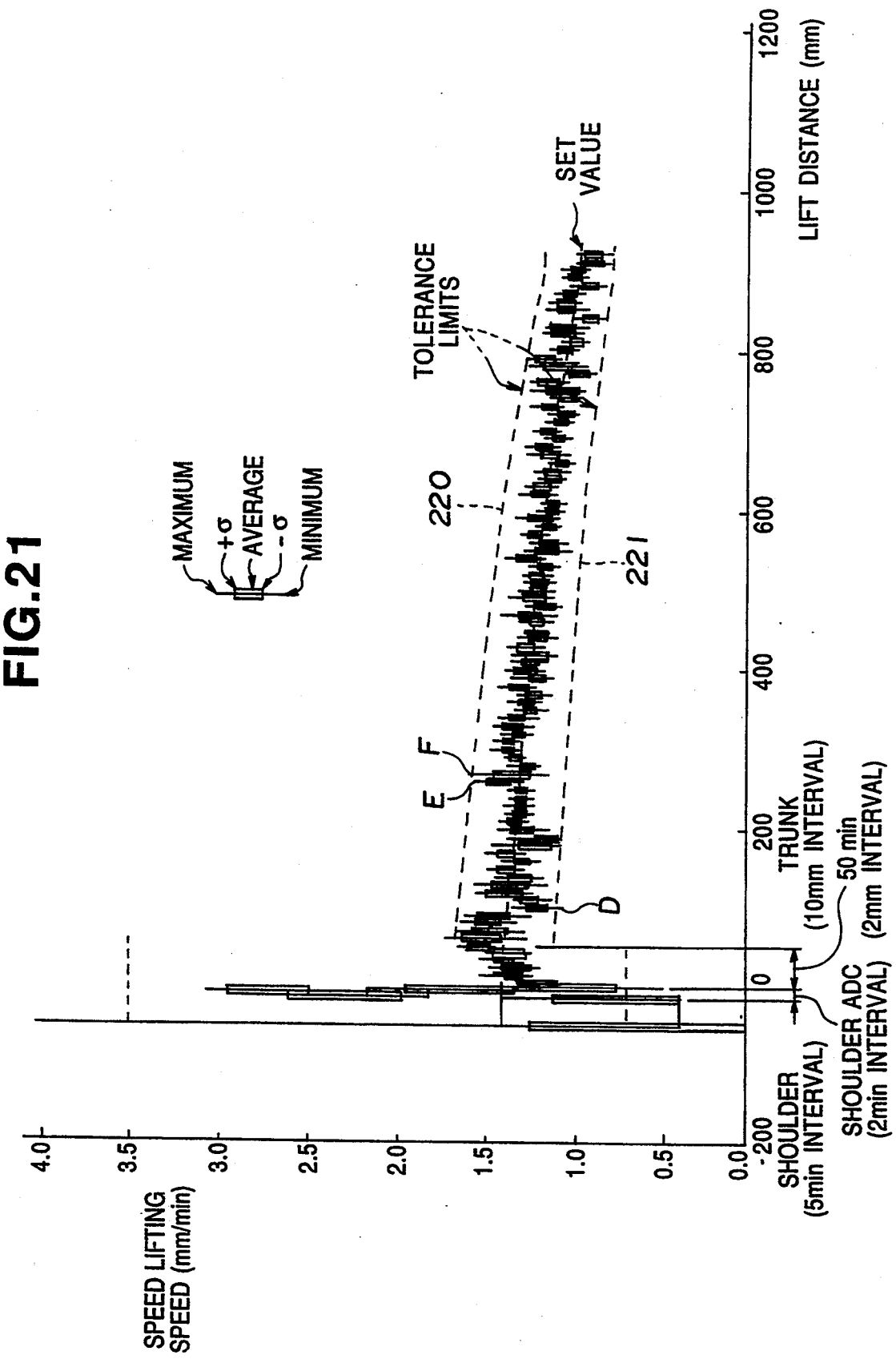

FIG.22

DRIVE CONDITIONS

CRYSTAL NUMBER=5878-81600     PARAMETER ID=4A-33-SS

| DATE | TIME | STATUS |
|------|------|--------|
| 01/25 | 20:00 | INITIATE VACUUM PROCESS |
| 01/25 | 21:00 | INITIATE MELTING PROCESS |
|       |       | CHARGE QUANTITY(kg) : 10.0 |
|       |       | LEAK QUANTITY(0.001torr·1/s) : 9.00 |
| 01/26 | 01:00 | MANUAL OPERATION |
| 01/26 | 01:00 | INITIATE SEED PROCESS |
| 01/26 | 02:00 | INITIATE SHOULD PROCESS |
|       |       | CRUCIBLE POSITION(mm) : 66 |
| 01/26 | 03:00 | MANUAL OPERATION |
| 01/26 | 03:00 | INITIATE TRUNK PROCESS |
| 01/26 | 04:00 | MANUAL OPERATION |
| 01/26 | 04:00 | TERMINATE SLOW LIFT OF SEED |
| 01/26 | 04:00 | TERMINATE CRUCIBLE ROTATION |
| 01/26 | 04:00 | TERMINATE SEED ROTATION |
| 01/26 | 04:00 | INITIATE RAPID LOWERING OF CRUCIBLE |
| 01/26 | 05:00 | TERMINATE RAPID LOWERING OF CRUCIBLE |
| 01/26 | 05:00 | INITIATE RAPID LOWERING OF SEED |

LIFT DISTANCE

| CRYSTAL NUMBER | CRYSTAL POSITION(mm) | ITEM | SET VALUE | CHANGE RATE |
|---|---|---|---|---|
| 0000-000 | 200~350 | SEED LIFTING SPEED | 1.00 | 20 |

SINGLE CRYSTAL GROWTH METHOD

FIELD OF THE INVENTION

The present invention relates to an improvement on a procedure for growing a single crystal in accordance with the Czochralski method (hereafter abbreviated as the CZ method).

PRIOR ART

As a process for manufacturing such crystals as silicon single crystals, a method known as the CZ method for growing single crystal is generally being used. In this method, the crystalline raw material that has been placed into the crucible is melted and, following contact of the seed crystal with the molten liquid, while the seed crystal and the crucible rotate in opposite direction to each other, resulting the seed crystal growing.

In an existing similar single crystal growth method, when the crystal is pulled up, the molten liquid level decreases and the surface of the melt, i.e. the condition of the single crystal growth surface, is altered thus after a while the single crystal comes to a point where it cannot be pulled up. Additionally, when the molten liquid level shifts, the quantity of oxygen dissolved from the molten liquid also changes, thus the axial oxygen concentration of the single crystal obtained is altered as well. Recently, an IG (Intrinsic Gettering) process which makes use of the oxygen precipitates has come into effect requiring a strict control over the oxygen concentration.

In dealing with this problem, the prior art carried out control of the molten liquid level using only a rate controller. The present process attempts to maintain the position of the molten liquid level in countering the crystal pulling up speed by fixing the lifting of the crucible at a constant speed such that volume of the displaced liquid portion is properly offset.

But in the prior art when drawing up single crystals using an automatic diameter controller, in the initial stages, during what is-known as "shoulder forming" before the body section of the crystal becomes fixed in diameter, the ratio of the rate controller is too small and the uniformity of the liquid level cannot be maintained. Thus, as a result, the precise liquid level corresponding to the constant section of the crystal could not be established. Furthermore, the thermal deformation that occurs at the single crystal pulling temperature in addition to change in the interior volume of the crucible both produced variation of the melt level. Consequently, through just the use of the aforementioned rate controller, precise control of the melt level was not possible in this prior method. Additionally, the oxygen concentration of the single crystal depends on both the temperature of the melt surface and the cooling rate of the crystal. Control of both, the amount of flow of the argon gas covering the liquid surface and the quantity of silicide evaporation were essential as was the precise control of the melt level position during the entire pulling period, from beginning to end.

However, in the CZ method, during the "seed" process in which the seed crystal is dipped into the melt and tapered upon pull up, if the temperature of the melt following melting of the raw material is even slightly off, dislocation-free crystal pulling is not possible. As a result, in this CZ method, after perfectly melting the raw material and overshooting 1500° C., it was essential to calm down the melt and stabilize the molten liquid convection inside the crucible. Additionally, it was essential that the oxygen concentration be fixed at a constant level at the melt surface in the initial pull up stage. However, the interior of the heat furnace is kept at an extremely high temperature and a thermometer cannot be set up, thus, in the prior art, detection of the melt temperature depends on the operator's perception. In actuality, the dipping and tapering draw up of the seed crystal was carried out using this detection method. But in the aforementioned process in which detection depends on the operator's perception, it is very difficult to measure precisely the temperature of the liquid. As well, an enormous amount of time is taken leading up to the aforementioned "seed" process, in addition to the fact that automation of the process is very difficult once the oxygen concentration of the initial stage is fixed at a constant value.

On the other hand, a method for indirectly estimating the molten liquid temperature by measuring the temperature of the carbon heater through a clear window, built into the outer container of the heat furnace, is also being used (First Publication Laid open number 63-107888). However, time is required for the liquid temperature to reach the temperature of the heater (i.e. due to the existence of time lags). In this process, the liquid temperature is actually controlled in accordance with the profile of the fixed time and temperature: establishing a fixed temperature was difficult. Moreover, a separate method exists in which a single spectormeter is used to directly measure the melt temperature through the clear window that was built into the container surface of the heat furnace. However, in this method, fluctuations in the temperature of the molten liquid at the time of melting produces clouding of the window due to the gas of the raw material gas from the melt surface. Thus the power of the spectrometer was susceptible to fluctuations and the method was liable to frequent error.

Additionally, there exists a PID control method for controlling the fixed temperature of the melt (proportional, integral, derivative control). In this PID control, the detection temperature, which is based on a appropriately established parameter, gives feedback to the electrical power of the heater. The parameter can then be adjusted further using the control result of the previous parameter. But when the condition of the PID control in the initial stage was unstable a number of disadvantages resulted: precise control was not possible and a great amount of time was needed to reach the optimum parameter. In addition, the time-fixed temperature was greatly separated from the temperature of the melt and the process became susceptible to overshooting.

In the manufacturing of single crystals in the prior art, among the various conditions for operating the draw up furnace, such things as the speed of pull up (in particular the growing speed of the crystal) and the heater temperature were automatically recorded on paper, but the other conditions were checked by the eye of the operator using standard set points.

But among the silicon single crystals manufactured in the manner described above, the solidification of the crystal produces many drawbacks such as point defects, or inconsistencies in the oxygen and carbon concentrations. It is known that these inconsistencies are the primary causes of fluctuations in the conditions at the time of pull up. However, the allowable sphere of these inconsistencies is not something that can be decided as a rule. This is because depending on the conditions under which the semiconductor is manufactured, the single crystal used will undergo many different heat histories, up until the end of the process, the oxygen precipitates fall within the limits of the field. The conditions come to demand the maintenance of the wafer strength, each kind manufactured for the customer is different as the conditions demand; and until the end of the process the precipitation of the oxygen has to be in an appropriate range, the strength of the waver has to be maintained and the necessary conditions varying with each kind of product for the customer are directed.

The radial distribution of the oxygen density becomes a problem, the oxygen precipitation depending on the density difference between the inner and surrounding part becomes nonuniform, a decline in the yield of the semiconductor chips and a warpage thereof occurs, production and transport equipment for semiconductors cannot be operated and it becomes obvious that a continued production becomes impossible.

Furthermore, when specific IC semiconductors are produced, inside the single crystal there exist regions often having oxidation stacking faults caused by oxygen which is generated during oxidation heat treatment (hereafter OSF occurrence region). If using wafers picked out from such an OSF occurrence region in the heat treatment process of the semiconductor IC production, OSF occurs and rejected chips is the consequence.

Therefore, for supplying a wafer fitting these specific semiconductor production conditions, semiconductor production is performed by using many kinds of quality samples for pulling up the conditions; the performance of the pull up at optimal conditions for product yield is normally done in the high integration semiconductor production.

Furthermore, for preventing specific semiconductor production conditions under which OSF frequently occurs, heat treatment is performed by assuming the riskiest conditions, and after the heat treatment, the OSF density is decided. Therefore, abnormal OSF occurrence regions are eliminated in an afterprocess; the single crystal undergoes slicing; samples are taken out from these slices after being oxidation heat treated under conditions which are decided by the customer; they are examined by sliced wafers and it is confirmed whether or not OSF occurrence regions exist. If OSF occurrence regions exist, then the parts before and behind this one are considered as a malproduct. In order to survey the IG effect, simulation heat treatment reproducing the heat history of specific ICs is regularly carried out and a decision is made on whether or not a change in the condition has occurred.

Furthermore, in prior art pull up methods for single crystals, not all of the various conditions for pulling up single crystals are recorded, even when the log record style is determined, record leaks and record misses cannot be avoided, and for all parts of single crystals thus obtained, it is usually difficult to accurately get hold of the information whether or not a region was in conformity with the demand of the customer.

Even when a quality test according to aforementioned sampling inspection is performed, completely satisfying test results are not obtained and there is demand for improvement.

SUMMARY OF THE INVENTION

The present invention takes into account the above described circumstances, and it is further an object of the present invention to provide a method which allows the exact control of the position of the melt surface, as well as by suppressing the dispersion of the oxygen concentration in axial direction, by which it becomes possible to produce a uniform single crystal.

For this reason, in the present invention a signal is caused to fall on the melt surface, the position of the molten liquid surface is determined by detecting the signal reflected from the molten liquid surface, and the crucible is lifted according to the deviation from a set value.

When the signal is radiated on the melt surface, which has ripples due to influences from the rotating crucible and the evaporating SiO, the incident signal is reflected at the molten liquid surface. Then, by detecting this reflected signal, the position of the molten liquid surface is measured, the crucible is lifted according to the deviation of the set value and the position of the molten liquid level can be controlled. Though a change of the molten liquid surface is caused by heat variations of the crucible, the position of the molten liquid level can be exactly controlled, and the condition of the melt surface, that is the growth surface of the single crystal, can be stabilized. Therefore, a single crystal having constant parameters, such as oxygen concentration in axial direction, can be produced.

It is another object of the present invention to measure the temperature of the liquid level accurately when molten, to detect that the molten liquid current is in a stationary state, and furthermore to be able to produce automatically a crystal without dislocations in the seed process where a seed crystal in the molten liquid is dunked in and thinly drawn up, by accurately controlling the temperature of the melt level at a set temperature, which is based on the aforementioned temperature.

Therefore, in the present invention, the surface temperature of the liquid is measured by taking the radiation energy ratio at two different wavelengths in the infrared emitted by the molten liquid surface. The heater current is regulated according to the deviation from the set value and the liquid surface temperature is controlled.

For measuring aforementioned melt temperature, it is advisable to make use of two thermometers which measure the molten liquid temperature by taking the radiation energy ratio at two different wavelengths in the infrared, emitted from the molten liquid surface.

Because for measuring the melt surface temperature by taking the radiation energy ratio at two wavelengths in the infrared region, which are radiated from the melt surface when molten, in the pull up method for single crystals of the present invention, even if there is condensation on the window with raw material gas originating from the molten liquid surface and the radiation intensity varies, both wavelengths are influenced in the same way and the radiation energy ratio at these two wavelengths does not change. For this reason, the temperature of the molten liquid surface can be accurately measured, independent of external factors, such as condensation on the window.

According to the single crystal growth method of the present invention, the molten liquid surface temperature of the raw material solution uneffected by external factors, such as precipitation on the window, can be exactly measured.

According to the single crystal growth method of the present invention, overheating by overshoot cannot occur and the liquid cannot evaporate excessively.

Since it is possible to accurately control the temperature of the liquid surface because of the aforementioned reason, a single crystal of determined shape and quality can be produced. Moreover, since the liquid surface temperature of the raw material solution can be accurately controlled with respect to time, automatic setting of timing for dipping the seed crystal into the molten liquid is possible which has the consequence that the manufacturing process can be automated. By measuring and controlling the liquid surface temperature, even during the draw up, the pulling speed can be stabilized and a silicon single crystal of very high quality may be produced.

It is another object of the present invention to surely get hold of the single crystal lot region which does not meet the conditions of the customer, and to provide a single crystal growth method which enables to improve quality reliance and stability.

Therefore, in the single crystal growth method of the present invention, data related to the draw up conditions during the pulling are detected and stored; the start time of each process during the draw up process is detected and stored; aforementioned stored survey data are compared with their beforehand stored corresponding tolerances; by outputting data failing the tolerances as nonconformity pulling information, after finishing the draw up it becomes possible to detect regions inside the single crystal which fail the draw up conditions; and furthermore all draw up data are conserved.

According to the single crystal growth method of present invention, it is impossible that operator entries are omitted or entry misses occur, and by comparing the observation data with the standard set values by means of computer processing, at the end of the pull up, it is possible to get hold of the parts failing the condition of the single crystal due to abnormal operation conditions which remain undetected in prior art logs. Then, in the slicing process following the pull up process, nonconform regions may immediately be excluded, and in an after process, nonconform regions can be prevented to be supplied.

Accordingly, regions failing the conditions as well as crystal lots not meeting the manufacturing conditions of the customer, may accurately be attained, and quality reliance and stability can be improved. Furthermore, by using the method of the present invention, it is possible to attain the status quo of the single crystal pull up from a central control room; malfunctions and mistakes of the pull up procedure can be corrected quickly by a supervisor via remote control if there occur abnormalities in the manufacturing process, such as a sharply decreasing yield rate, or interruptions in the process continuation, though the shipping was judged to meet quality standards and has not shown any abnormals, it is possible to call immediately those data on the screen which lie back a reasonable period of time which gives the possibility to recheck the detailed history of the draw up, to specify a crystal lot pulled up under identical conditions or exclude the ones currently in the manufacturing process. Furthermore, if there appear differences in identical semiconductor manufacturing conditions within a crystal lot, it is possible to newly discover the relation between the operation, which was formerly overlooked, and the single crystal quality, by comparing and examining these data, and single crystal draw up conditions which are most suitable for a variety of semiconductor manufacturing conditions may be set. These are the most important effects of the present invention.

BRIEF DESCRIPTION OF THE DRAWINGS

FIG. 20 shows the screen to which all tolerance fluctuation rate parameters are input.

FIG. 21 is a graph where the seed growth speed is displayed in the axis of ordinate and the draw up length in the axis of abscissa.

FIG. 22 shows the screen display of the operation condition.

PREFERRED EMBODIMENTS OF THE INVENTION

Hereinafter, a detailed explanation on the single crystal growth method of the present invention is given by reference to the figures.

First preferred embodiment

Figure 1:
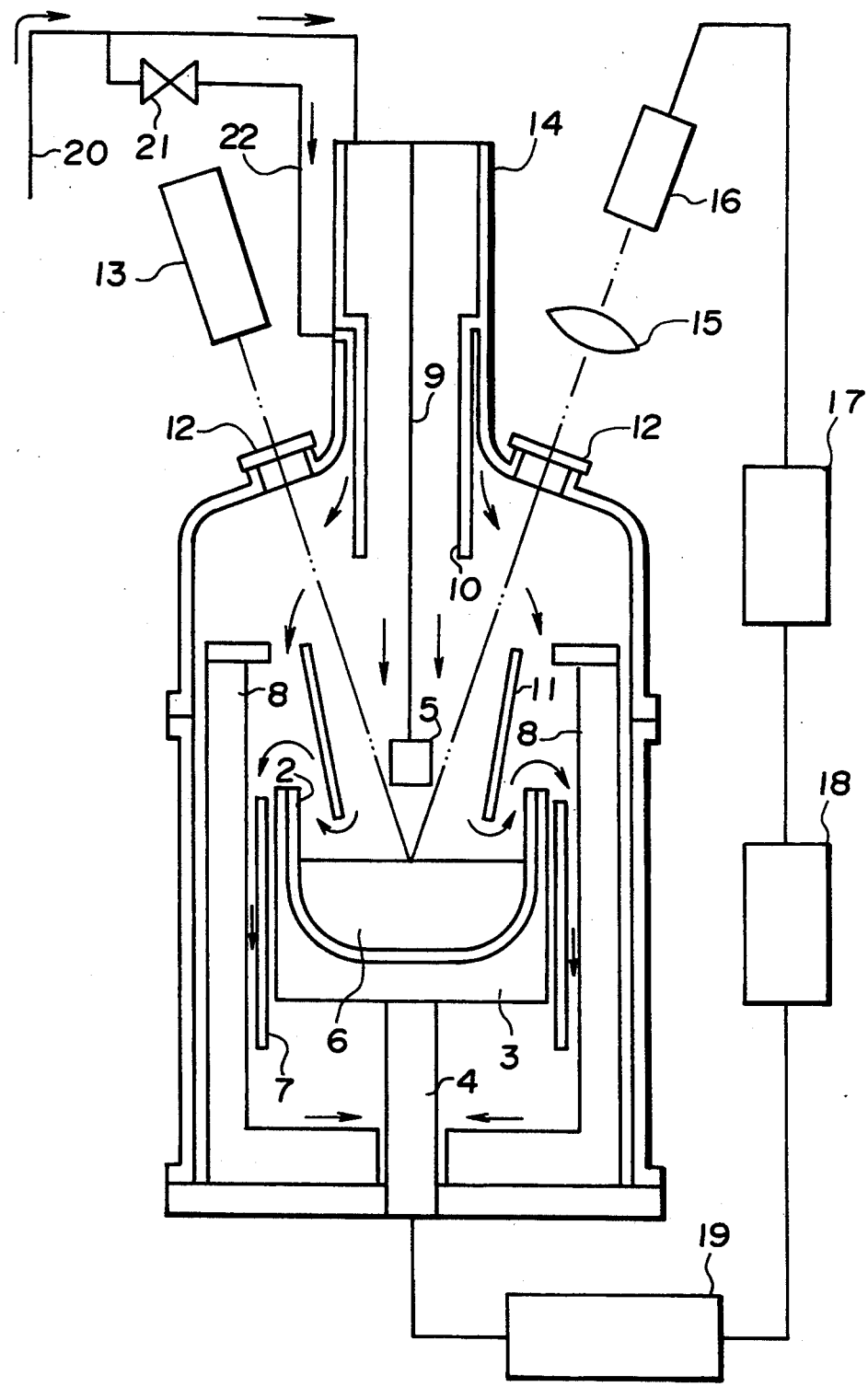
FIG. 1 shows a schematic diagram of an equipment which is an example for the implementation of the single crystal growth method stated in claim 4.

FIG. 1 shows an example of the single crystal pulling equipment used for implementing the single crystal growth method according to claim 4.

In this figure, there is a furnace main body 1; and roughly in the center of this furnace main body 1 a quartz crucible 2 is provided. In the inner part of this quartz crucible 2, the single crystal raw material is allocated and becomes the molten liquid 6 when dissolved. Furthermore, this quartz crucible 2 is installed via a graphite susceptor 3 on a lower axis 4, which can move up and down and rotate. Then, a carbon heater 7 controlling the temperature of the molten liquid 6, which is contained in the quartz crucible 2, is provided in the vicinity of aforementioned quartz crucible 2. Moreover, an insulation tube 8 is installed between heater 7 and furnace main body 1. In this insulation tube 8, a tube shaped radiation heat shielding body 11 is supported by a plurality of engagement parts. This radiation heat shielding body 11 is tapered in downward direction. This radiation heat shielding body prevents changes of the heat history of the pulled crystal, has the function of preventing impurities, such as CO gas originating from e.g. heater 7, enter the single crystal. The distance between the liquid surface and the tip of the radiation heat shielding body 11 must accurately be set in order to standardize the current path of the gas.

Furthermore, a single crystal cooling pipe 10, which is water cooled, is attached to the neck part 14 of furnace main body 1. This single crystal cooling pipe 10 sticks out into furnace main body 1 and serves for controlling the heat history of the silicon single crystal during the pulling. Between the aforementioned single crystal cooling pipe 10 and the neck part 14 of furnace main body 1, the pipe shaped gas current path is being formed. Furthermore, in the inner part of this single crystal cooling pipe 10 and neck part 14 of furnace 1, a wire 9 holding the seed crystal 5 and performing the draw up, is fixed in a hanging position and can freely move up and down and rotate. Next a feed pipe 20 for supplying Argon gas to the inside of single crystal Cooling pipe 10 is connected to the upper end of aforementioned neck part 14. Furthermore, a window 12 is provided in the shoulder part of furnace main body 1.

Furthermore, a laser light source 13 for radiating laser light on the surface of molten liquid 6, a focus lense 15 for focusing the laserlight reflected at the molten liquid surface 6 and an optical sensor 16 for absorbing the focused reflected light are provided in the outer part of aforementioned furnace 1. In the outer part of furnace main body 1, there are further provided: a monitor 17 displaying the difference between the set value and the molten liquid surface position to which the electric current signal output by optical sensor 16 was converted, a feedback control apparatus for feeding back this difference, and a crucible control apparatus 19 controlling the position of the crucible.

When producing a single crystal by using the single crystal pulling equipment constructed as mentioned before, argon gas is put into furnace main body 1 via aforementioned feed pipe 20; the ambient inside the furnace main body 1 is substituted by argon gas; the single crystal raw material which was placed beforehand into the inside of quartz crucible 2 is dissolved to molten liquid 6 by means of heater 7; and then the temperature of molten liquid 6 is maintained at an adequate temperature for the single crystal pulling (melting process).

Next, wire 9 is lowered and the lower surface of seed crystal 5, which is positioned at the lower end of wire 9, is brought in direct contact with molten liquid 6. Thereafter, quartz crucible 2 and seed crystal 5 are caused to rotate in opposite direction of each other, and by pulling wire 9 at a constant speed, the growth of the single crystal at the bottom end of seed crystal 5 is initiated. In the meantime, at every second interval of a certain period, laser light is emitted from laser emitting apparatus 13 and caused to fall on the liquid surface of the molten liquid 6. The laser light reflected on the liquid surface is focused by focus lense 15, outputted as electric current signal by optical sensor 16, and then this electric current signal is simultaneously converted to the liquid surface position value and displayed at monitor 17 if the liquid surface position deviates from the set value, it is fed back to crucible control apparatus 19 by feed back control apparatus 18, quartz crucible 2 having constant speed is moved upwards by crucible control apparatus 19, and the surface of molten liquid 6 is controlled (seed process).

Moreover, at the time just before the diameter of the pulled single crystal becomes constant and the liquid surface position measured by aforementioned laser-light is equal to the set value, quartz crucible 2 is elevated at constant speed by crucible control apparatus 19. When the position of the molten liquid level is higher than the set value, quartz crucible 2 is lifted with a crucible lifting speed which is decreased by a fixed ratio when compared with the aforementioned constant speed. When the position of the molten liquid surface is lower than the set value, the quartz crucible 2 is lifted with a crucible lifting speed which is increased by a fixed ratio when compared with the aforementioned constant speed. Thus, the position of liquid 6 is controlled (shoulder process).

Proceeding like this, while controlling the liquid surface position of molten liquid 6, the silicon single crystal is drawn up and due to the approach of the shoulder part of the silicon's single crystal upper part to the tapered opening of radiation heat shielding body 11 and to the lower end of crystal cooling pipe 10, the current path resistance of the argon gas, which is streaming downwards at the inner part of single crystal cooling pipe 10, increases, but because the argon gas flux flowing through branch pipe 21 increases and the amount of gas, which contains heated SiO and is located between the molten liquid and the radiation heat shielding body 11, is increased, consequently, a sudden change in the flow of argon gas supplied to the crystal growth surface can be suppressed. Accordingly, there is no sudden temperature change in the crystal growth face neighbourhood of the quartz crucible 2 and the ventilation of SiO coming from molten liquid 6 can be smoothly put into practice, crystal defects don't occur, and it is possible to pulled the silicon single crystal such that the variation of oxygen density stays small.

If a single crystal has been pulled to the desired length according to the aforementioned procedure, the liquid surface control is stopped, the power for heater 7 switched off and the draw up of the single crystal is terminated (bottom process).

Figure 2:
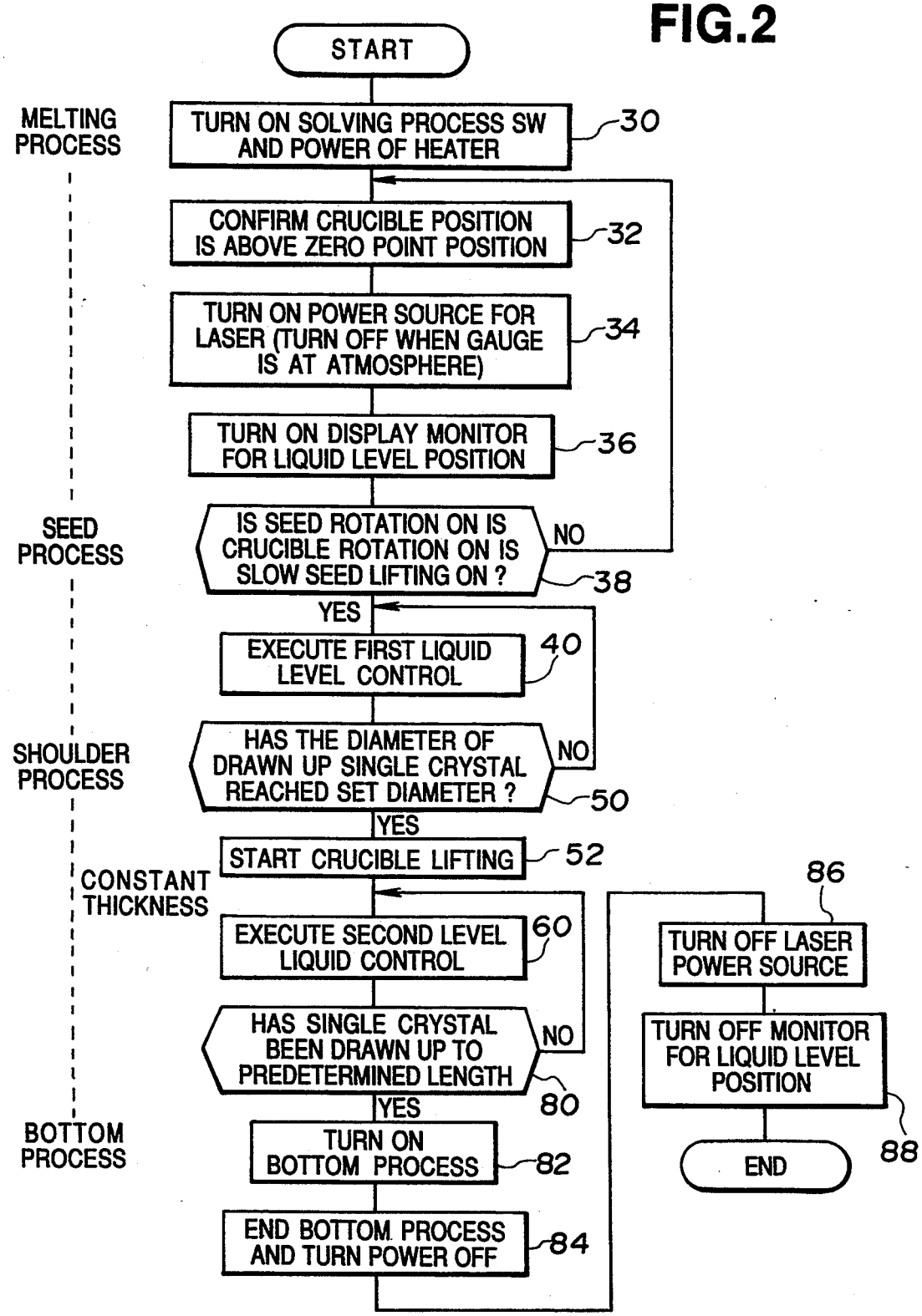
FIG. 2 is a flowchart showing the process of the first preferred embodiment.
Figure 3:
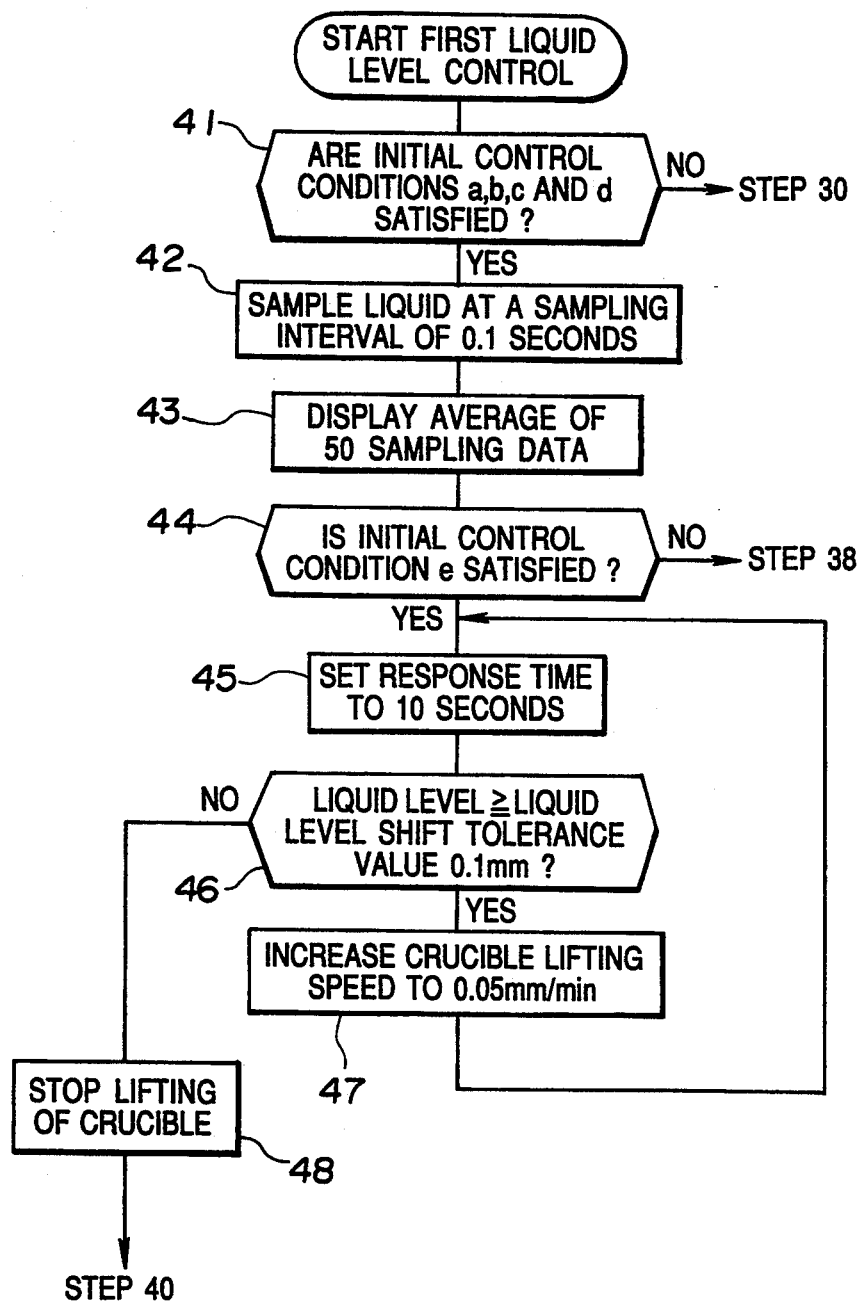
FIG. 3 is a flowchart showing the first process of the liquid surface control method.
Figure 4:
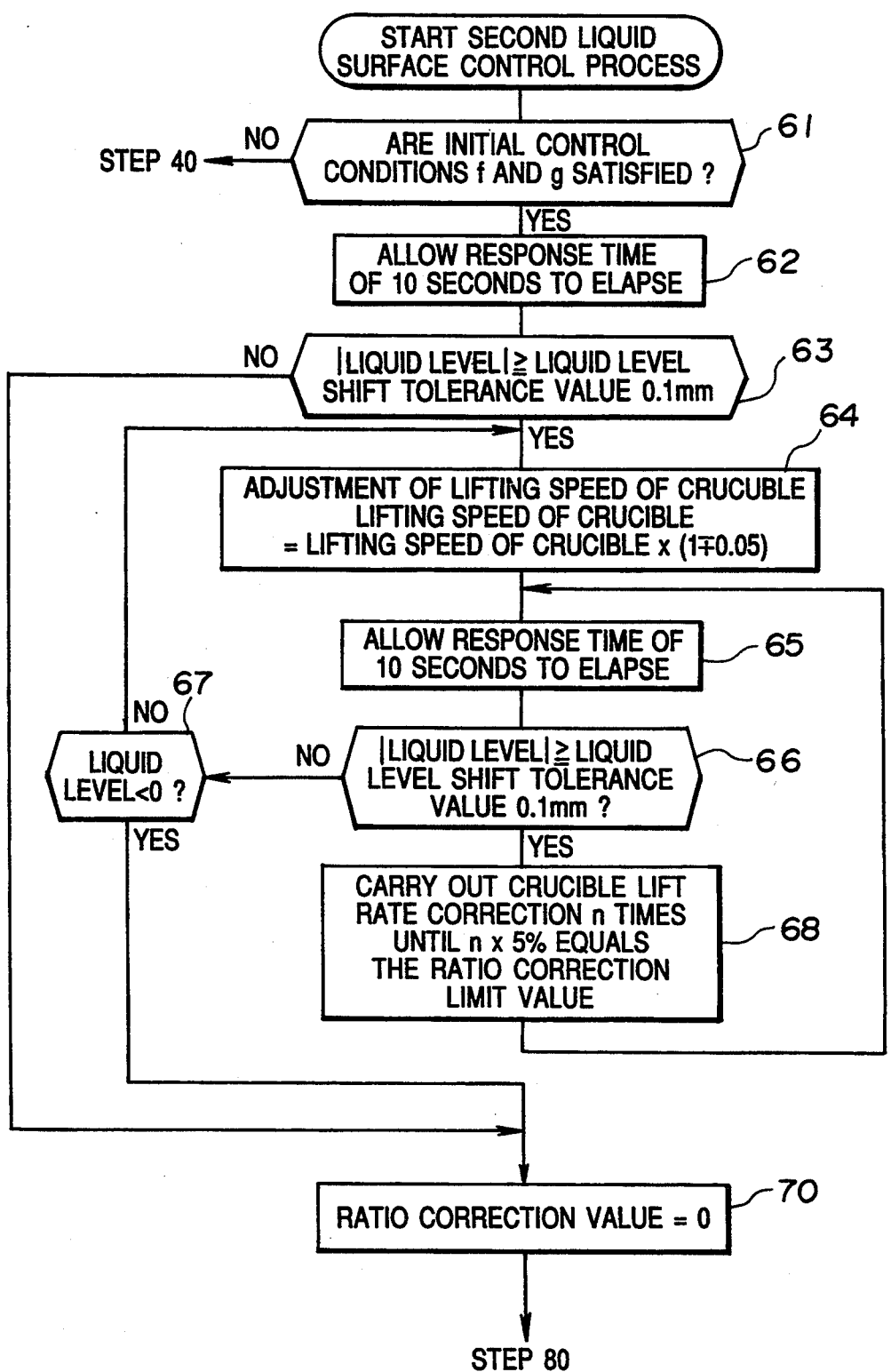
FIG. 4 is a flowchart showing the second process of the liquid surface control method.

Next, the operation procedures in all the aforementioned processes are once more explained in detailed by following the flow-charts from FIG. 2 to FIG. 4.

1. Melting process

First, the solving process SW is put on, power of heater 7 is put on (step 30), and by dissolving the single crystal raw material, which is put into the quartz crystal crucible 2, molten liquid 6 is obtained. Next, after having made sure that the crucible position is above the zero point position (step 32), the power source for laser emitting apparatus 13 is switched on (step 34). At this point, the vacuum gauge (not shown in the figure) provided inside the furnace main body I is switched off when there is an atmosphere. Furthermore, the display of monitor 17 for the liquid level position is started (step 36).

2. Seed process

Next, wire 9 is lowered and the lower surface of seed crystal 5, which is attached to the lower end of wire 9, is brought into contact with molten liquid. After this, quartz crucible 2 and seed crystal 5 are caused to rotate in opposite direction (seed rotation on, crucible rotation on), and by drawing up wire 9 at constant speed the growth of the single crystal at the lower end of seed crystal 5 is being started (slow seed lifting on) (step 38). When at this point either aforementioned seed rotation, crucible rotation or slow seed lifting is put off, the control is stopped and sent back to step 32 of dissolution process 1.

After step 38, the first liquid level control is executed (step 40). On the subject of this liquid level control method, detailed explanations are given by following the flow chart in FIG. 3.

At the beginning of this liquid level control, it has to be checked whether the following conditions are satisfied (liquid level control start conditions).

a) Laser liquid level control flag is set.
b) Power of heater seven is available.
c) The inside of crucible main body 1 is decompressed below a certain pressure.
d) The position of the crucible is set above the zero point.
e) The seed rotation, crucible rotation and slow seed lifting is switched on.

If it is certain that among the conditions a to e conditions a, b, c, d are satisfied (Yes case of step 41), the laser light emitted from laser emitting apparatus 13, whose interval is set to a sampling time of 0.1 sec., falls on the surface of molten liquid 6; the laser-light reflected by the liquid surface is focused by focus lense 15 and the absorbed value is sampled with optical sensor 16. Furthermore, for smoothing the liquid surface position, 50 sampling data are accumulated; the average of these 50 data is taken and displayed as liquid surface position at monitor 17 (step 42, step 43).

Next, if condition e is satisfied, liquid surface control is started (Yes case of step 44).

First, the response time (interval of time which is fed back to crucible lift) is set to 10 seconds. When this time has passed (step 45), it is determined whether or not the liquid level position lies within the liquid level shift tolerance value of 0.1 mm (step 46).

In case the liquid level position lies outside the range of liquid level shift tolerance value, the crucible lifting speed is increased to 0.05 mm/min (step 47), and if the liquid position lies within the liquid level shift tolerance value (No case of step 6), the lifting of the crucible is stopped (step 48).

After step 48 is terminated, step 50 shown in FIG. 2 follows next.

On the other hand, if in step 41 not each of the steps a to d are satisfied, there is a jump back to step 30 in FIG. 2. If further condition e in step 44 is not satisfied, there is a jump back to step 38 shown in FIG. 2.

3. Shoulder Process

Furthermore, the diameter of the drawn up single crystal (shoulder diameter) is detected, and it is determined whether it became equal to the diameter which set the crucible lifting start (step 50 of FIG. 2). If it equals the set diameter, the crucible lifting starts (step 52) and the second level liquid control is performed (step 60).

If on the other hand the shoulder diameter does not match the set diameter (No case of step 50), the first liquid level control process of step 40 is repeated.

A detailed explanation of the second surface liquid control method is given by following the flowchart shown in FIG. 4.

First, when starting the second liquid surface control, it is checked whether the conditions stated hereafter are satisfied (liquid surface control start condition) (step 61).

f) Performance of first liquid surface control.

g) The shoulder diameter becomes equal to a beforehand set diameter, the crucible is lifted and the start of the second liquid surface control can be prepared.

If, on the other hand, one of the conditions f, g is not satisfied (No case of step 61), there is a jump back to step 40 in FIG. 2, and if conditions f, g are satisfied (Yes case of step 61), after passing the response time of 10 seconds (step 62), it is determined whether the liquid level position lies in the liquid level shift tolerance value of 0.1 mm (step 63).

if the liquid level position lies within the range of the liquid level shift tolerance value (No case of step 63), step 70 follows, the crucible is lifted at the crucible lifting speed (hereafter called standard crucible lifting speed), which is calculated by (seed lifting speed)×(crucible lifting ratio). (In other words, ratio correction value of crucible lifting is 0).

On the other hand, if the liquid level position does not lie within the range of the liquid level shift tolerance value (Yes case of step 63), the liquid level control described hereafter is performed.

First, when the liquid level position is lower than the liquid level set value, the crucible lifting speed is corrected by increasing the lifting speed with a correction ratio of only 5% (step 64). The response time is 10 seconds (step 65). By repeatedly performing liquid level measuring, it is determined whether it lies within the range of the shift tolerance value (step 66); if the liquid level position lies repeatedly under the liquid level set value (Yes case of step 66), the correction ratio is newly added, and there is an increase towards the standard crucible lifting speed of a 2×5% correction value part lifting speed. Proceeding like this, the correction ratio is added to the crucible lifting speed until the liquid level position becomes the liquid level set value, in other words, in the meantime, when there occurs n times such a correction, the crucible lifting speed is increased by correction value n×5% when compared with the uncorrected value (step 68). This correction continues until n×5% becomes the ratio correction limit value (No case of step 69). If the liquid level position enters the range of the shift tolerance value before it becomes equal to the ratio correction limit value (No case of step 66), it is decided whether the liquid level position is below 0 (step 67), and if the liquid level position is below 0 (Yes case of case 67), step 70 follows. Furthermore, if the liquid level position is greater than 0 (No case of step 67), there is a jump back to step 64, and the correction of the crucible lifting ratio is repeatedly performed.

On the other hand, if the liquid level position of molten liquid 6 is higher than the liquid level set value, the crucible lifting speed is stepwise decreased by the correction ratio (5%), and the lifting speed decreases. In other words, if there are n corrections until reaching the liquid level set value, the crucible lifting speed is decreased by correcting it n×5% (step 68). Then, if the liquid level position reaches the shift tolerance value (No case of step 66) and the liquid level position is below 0 (Yes case of step 67) or n×5% exceeds the ratio correction limit value, the standard crucible lifting speed before the correction is reactivated, and the crucible is lifted (step 70). After step 70, step 80 displayed in FIG. 2 follows.

4. Bottom process

After having performed the draw up of the single crystal described hereinafter, it is confirmed whether-the draw up has reached a predetermined value (step 80). If the single crystal has not been drawn up to a predetermined length (No case of step 80), there is a jump back to the second liquid control process of step 60. If the crystal has been drawn up to a predetermined length (Yes case of case 80), the bottom process is switched on (step 82), and thereafter, the bottom end or Power Off is reached (step 84), the laser power source is switched off (step 86), the liquid surface position monitor is switched off (step 88) and the single crystal draw up is finished.

This liquid surface control method makes use of causing laser light to fall on to the liquid surface of molten liquid 6 at the time of draw up growth of the single crystal, and by detecting the reflected light from the surface, the shift from the set value of the liquid surface position is measured, and since there is a method lifting the crucible according to this shift, it is possible to exactly control the liquid level position even in the shoulder forming process (seed process) which was difficult to be controlled by hitherto liquid level position controls. Even if there occurs a change in the liquid level position of molten liquid 6 by heat deformation of quartz crucible 2, the liquid level position can be controlled more accurately, and it becomes possible to stabilize the molten liquid surface, or in other words, the condition of the single crystal growth surface. By using the radiation heat shielding body board and by drawing up the single crystal, a single crystal can be produced so that the variation of the oxygen density in axial direction becomes smaller.

Second preferred embodiment

By using the apparatus of the first preferred embodiment, a silicon single crystal was produced.

At a pressure of 10 Torr inside furnace main body 1 and an argon gas flux of 30 Ni/min, 50 kg of polycrystal silicon are dissolved in the quartz crucible 2, which has a diameter of 16 inch. After the temperature of molten liquid 6 inside the quartz crucible 2 has reached a level where it is possible to perform the draw up, wire 9 is lowered and seed crystal 5 is brought in direct contact with molten liquid 6. Then the revolution speed of seed crystal 5 is set to 22 rpm, the revolution speed of quartz crucible 2 to 5 rpm, and the silicon single crystal is drawn up at a speed of approximately 1.5 mm/min.

From the time when the dissolution of the raw material has finished, laser is shone on the liquid surface by laser equipment apparatus 13, the liquid position of molten liquid 6 is 50 times sampled in an interval of 0.1 sec, and the molten liquid position is smoothed. Then the shift tolerance range is set to +0.1 mm. If there is a deviation beyond this margin, feed back control equipment 18 is put into action. A one time correction of the crucible lifting speed is set to +0.5% and the limit value where the crucible lifting speed can be corrected is set to +20%. The time interval from measuring the liquid level to the control of the crucible shifting speed is set to 10 seconds. By controlling the liquid level position of molten liquid 6 in such a way, it was possible to take the difference between the liquid level shift and the set value within a range of 0.1 mm during the control process period.

Figure 5:
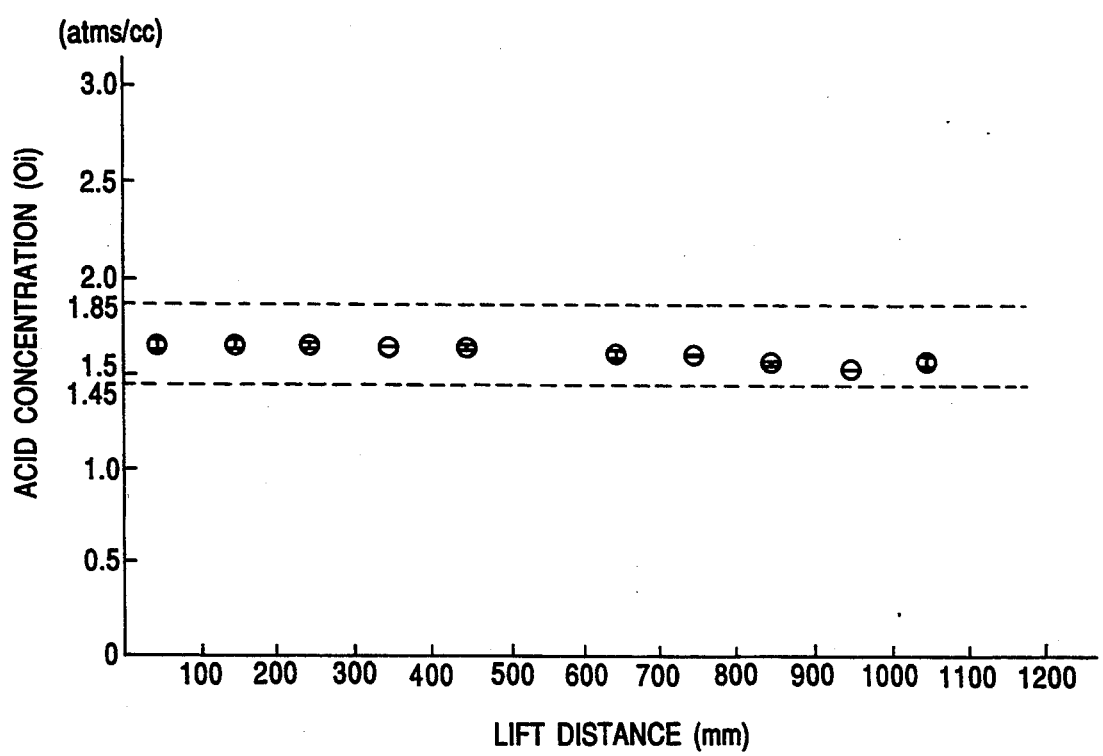
FIG. 5 is a graph showing the dispersion of the oxygen density in axial direction of the silicon single crystal manufactured according to the second preferred embodiment.
Figure 6:
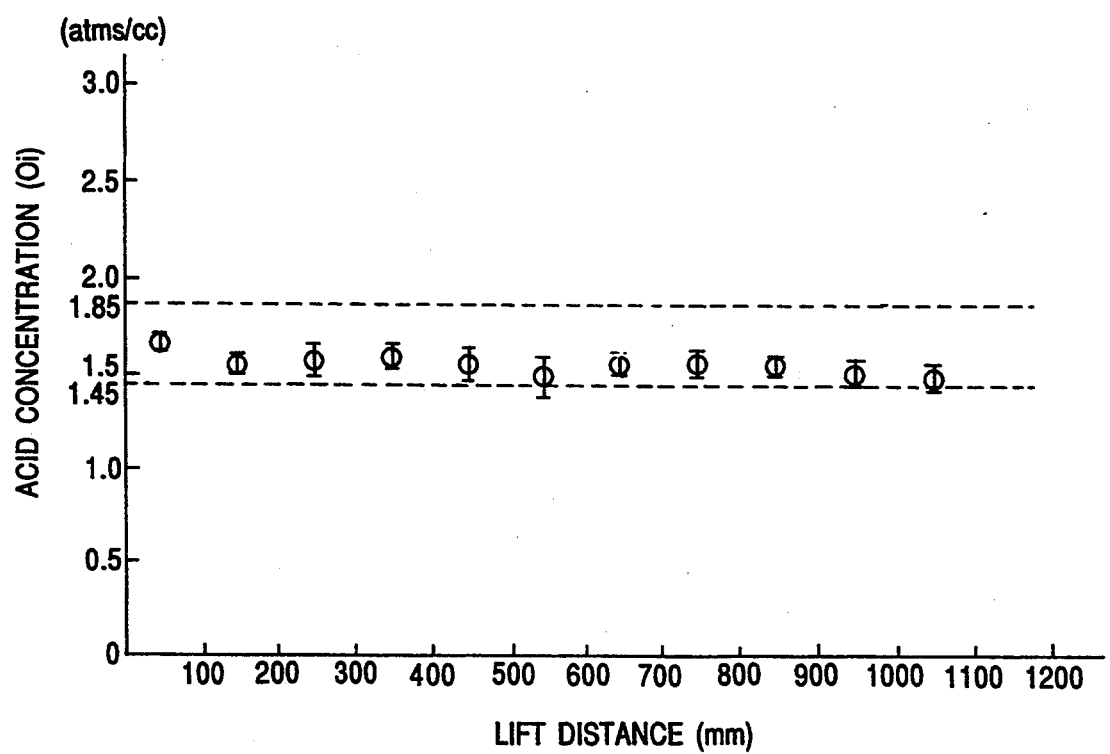
FIG. 6 is a graph showing the dispersion of the oxygen density in axial direction of the silicon single crystal manufactured according to a comparative example.

The oxygen density dispersion in axial direction of the silicon single crystal obtained from this example is shown in FIG. 5. Furthermore, the oxygen density in axial direction of the silicon single crystal produced according to the former ratio control is shown as a comparative example.

As a result of this, it was confirmed that the oxygen density in axial direction stayed roughly constant when control of the molten liquid surface was performed by laser.

Third preferred embodiment

Figure 7:
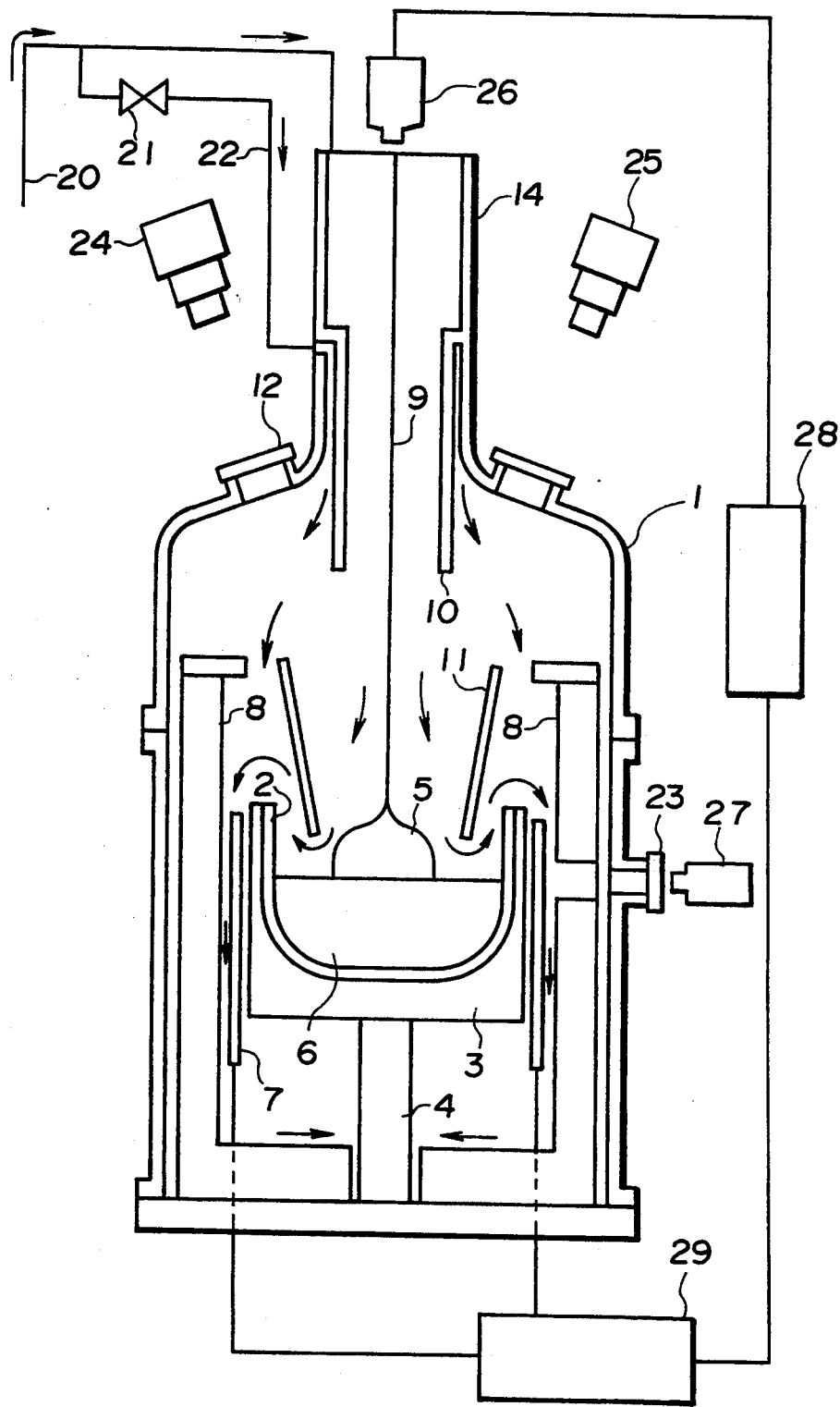
FIG. 7 is a schematic diagram showing an example of an equipment for implementing the single crystal growth method of claim 5.

FIG. 7 shows an example of a single crystal pulling apparatus for implementing the single crystal growth method according to claim 5.

In this figure, identical signs are attached to similar construction parts for simplifying explanations.

Points at this apparatus which differ from the apparatus of the first preferred embodiment, are the points following hereafter, whereas the other parts are similar to the ones of the first preferred embodiment.

In the inner part of aforementioned furnace main body I an ADC sensor 24 for measuring via window 12 the diameter of the silicon single crystal to be pulled up and a line camera 25 are provided.

Furthermore, a window 23 is provided at the side part of furnace main body 1. Via this window 23, ATC sensor 27 measures the temperature of heater 7. On the upper part of neck part 14 of furnace main body 1, a dichromatic thermometer 26 for measuring the temperature of molten liquid 6, is provided. To this dichromatic thermometer there are connected, a computer system 28 which determines the power for heater 7 by PID control according to the result obtained by calculating the discrepancy between the measured temperature and the set temperature, and an SCR controller 29 controlling the power for heater 7.

If a single crystal draw up apparatus constructed like the one mentioned before is used and a single crystal is produced, first, valve 21 is activated, and at a fixed manufactured opening, argon gas is fed into the inner of furnace main body 1 via aforementioned feed pipe 20 and branch pipe 22, and while the ambient inside furnace main body 1 is replaced by Argon gas, the single crystal raw material which was put beforehand into quartz crucible 2, is dissolved by heater 7 (dissolving process). Inside quartz crucible 2, the temperature control for the single crystal raw material melting period is performed as described above.

The liquid surface temperature is measured by using a dichromatic thermometer 26, which is attached to the outer part of furnace main body 1, yields the reflected energy ratio of two waves which are reflected by the molten liquid surface at the time of dissolving and have different wavelengths in the infrared. The heater power corresponding to the discrepancy between the liquid level temperature and the set temperature comes from SCR controller 29 backed up by the PID control in computer system 28 and is applied to heater 7. Thus, the liquid surface temperature is regulated to the set temperature.

After having maintained the temperature of dissolved, molten liquid 6 at the set temperature suitable for the single crystal pulling, wire 9 is lowered and the seed crystal attached to the bottom end of wire 9 is dipped into molten liquid 6. Then, by pulling the seed crystal, while quartz crucible 2 and the seed crystal rotate in opposite directions, the silicon single crystal 5 is caused to grow at the bottom end of the seed crystal (seed process).

Since the shoulder part in the upper part of silicon single crystal 5 approaches the bottom end of single crystal cooling pipe 10 and the opening part of radiation heat shielding body 11, which is shrunken in diameter, at the time when the silicon single crystal 5 is pulling in aforementioned way, the flow path resistance of the argon gas flowing down the inner part of single crystal cooling pipe 10 increases. Since there is an increase in both, the flux of argon gas streaming through branch pipe 22 and the amount of gas containing heated SiO and located between the molten liquid and the radiation heat shielding body 11, as a result, a sudden change in the flow of argon gas supplied to the crystal growth surface is suppressed. Therefore, a sudden temperature change in the single crystal growth surface vicinity inside quartz crucible 2 does not occur, the ventilation of SiO from molten liquid 6 is smoothed, the crystal has no dislocations, and it is possible to proceed with the draw up of silicon single crystal 5, so that there are only small variations of oxygen concentration.

Figure 8A:
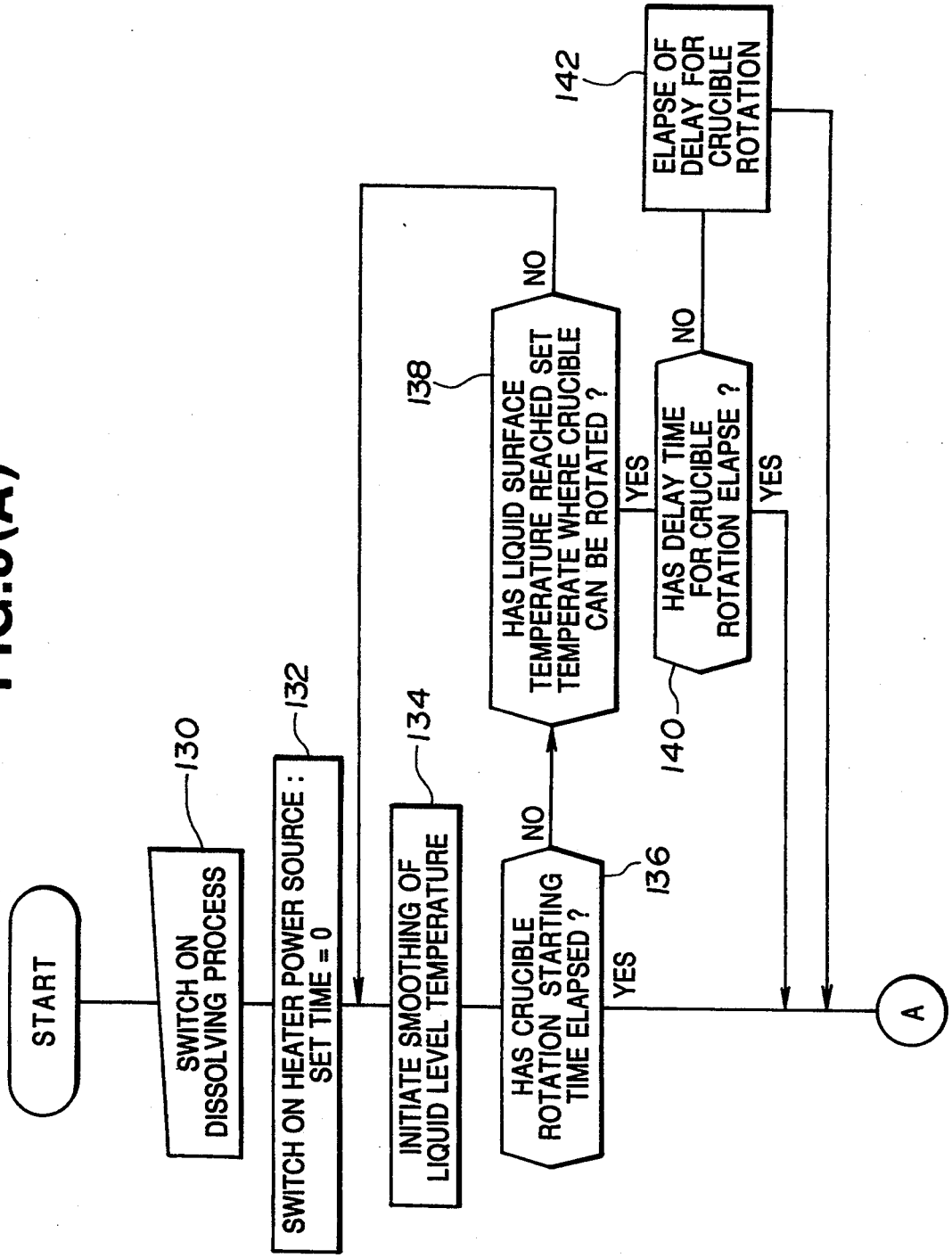
FIG. 8 is a flowchart for explaining the melt process.
Figure 8B:
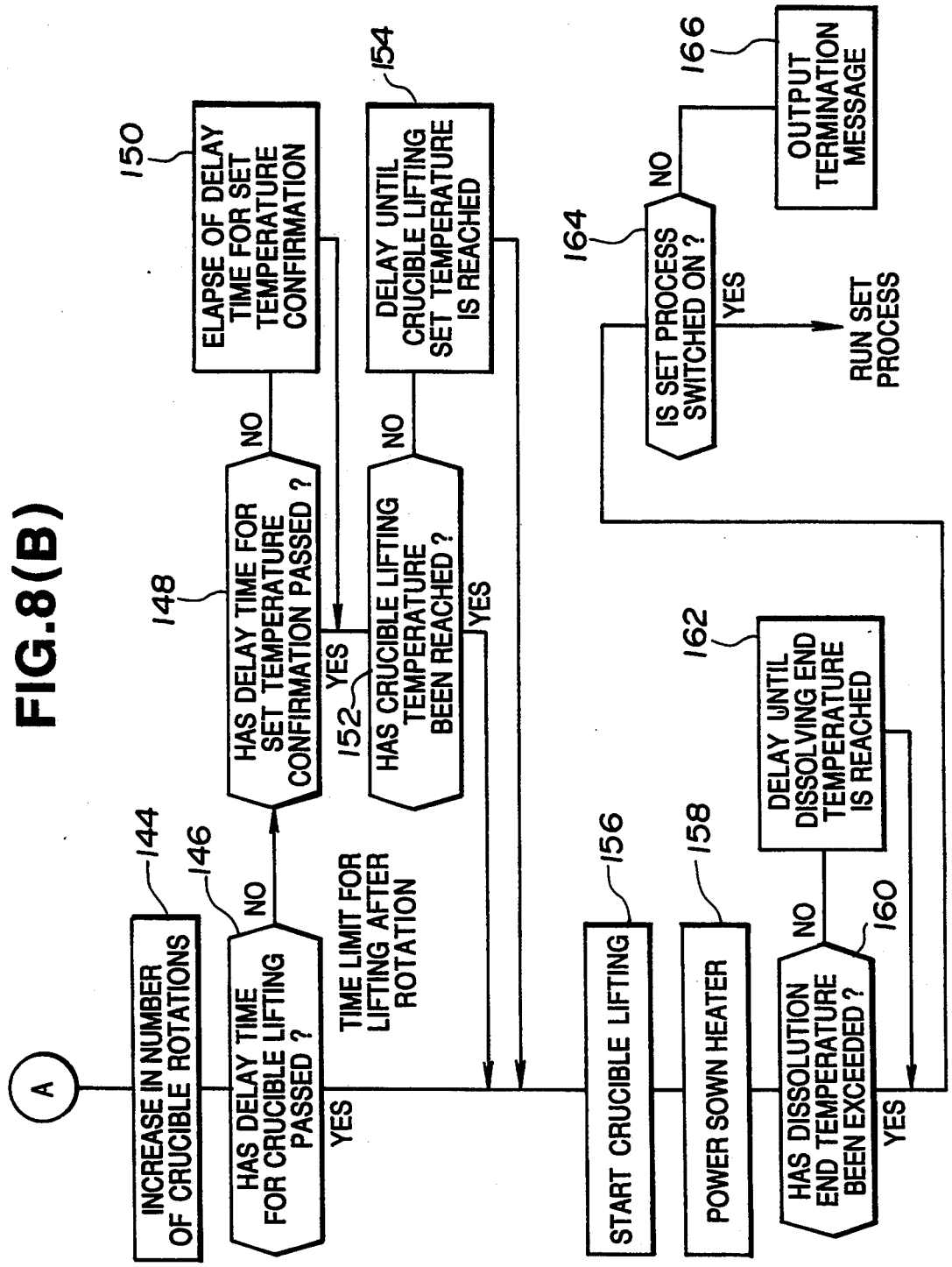
Figure 9:
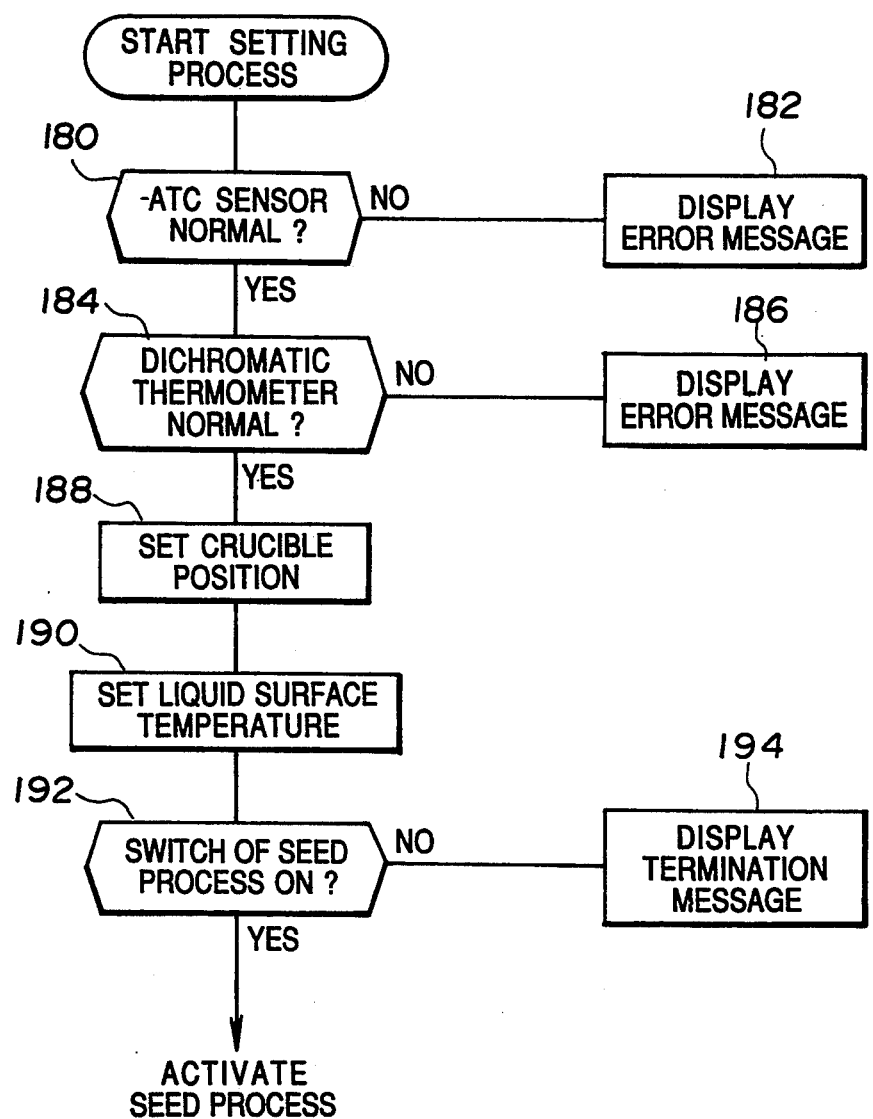
FIG. 9 is a flowchart for explaining the setting process.

Though it is possible to grow a silicon single crystal 5 of surpassing quality by the aforementioned method, a detailed explanation on the process controlling the liquid surface temperature to the set temperature before dipping the seed crystal into molten liquid 6, is given by the flow-charts in FIG. 8 and FIG. 9.

First, an explanation on the dissolving process for dissolving the single crystal raw material is given by following the flow chart of FIG. 8.

The SW of the dissolving process is switched on (step 130), the heater power source is switched on and the voltage of heater 7 is raised to a fixed value. At the time when the heater power source is switched on, time is set to 0 (step 132).

Then, the use of the dichromatic thermometer 26 and the smoothing of the liquid level temperature is started (step 134 of FIG. 8). If the decision whether the crucible rotation starting time has passed is Yes (step 136), the crucible rotation is started (step 144). If this decision is no, and the decision on whether the liquid surface temperature has reached the set temperature where the crucible can be rotated (step 138) is Yes, it is decided whether or not the delay time until the crucible may be rotated has passed (step 140). If the answer to step 140 is Yes, step 144 follows next and the crucible rotation is started. On the other hand, if the answer to step 138 is No, there is a jump back to step 134, and if the answer to step 140 is No, step 144 follows after the delay time until the crucible rotation can be started (step 142) has passed.

In step 144, the number of revolutions of quartz crucible 2 is increased to the set rotation value by a process described hereinafter.

First, after having confirmed that the crucible rotation starting time has passed since the set time, the message of rotation start inquiry is output and by detecting the crucible rotation switch on On, the crucible rotation start is confirmed.

Second, after the crucible rotation switch is set on On, by controlling the crucible rotation motor, the number of revolutions of the crucible is slowly increased until the set revolution number is reached.

When the crucible revolution number has reached the set revolution number, it is decided whether the delay time for lifting the crucible has passed (step 146). If the answer is Yes, step 156 follows and the crucible lifting is started. If the answer is No, it is decided whether the delay time for the set temperature confirmation where the crucible can be lifted has passed (step 148); if the answer is Yes, it is decided-whether the crucible has reached the temperature where is can be lifted (step 152). In case the answer to step 152 is Yes, step 156 follows and the crucible lifting is started. On the other hand, if the answer to step 148 is No, step 152 follows after the delay time for the set temperature confirmation where the crucible can be lifted has passed (step 150). If the answer to step 152 is No, step 156 follows a pause until the set temperature where the crucible can be lifted is reached (step 154).

In step 156 the crucible lifting is started, and lifted continuously to a beforehand set crucible lifting distance. Next, heater 7 is powered down to a fixed value (step 158), the liquid surface temperature is detected by dichromatic thermometer 26, and it can be decided whether the dissolution end temperature is exceeded (step 160).

if the answer to step 160 is Yes, it can be decided whether the set process is switched on (step 164); if Yes, the later stated set process is run. If No, a message of termination is output ( step 166 ).

If the answer to step 160 is No, step 164 follows after waiting until the dissolving end temperature is reached (step 162).

Next, a detailed explanation on the set process by following the flow chart in FIG. 9 is given.

First, in step 180, it is checked whether ATC sensor 27 is normal. This check is performed by detecting the temperature of heater 7 by ATC sensor 27, and if the detected temperature is lower than the lower limit of ATC sensor 27 (No case of step 180), an error message is displayed (step 182). If the temperature detected by ACT sensor 27 is higher than the lower limit of ATC sensor 27 (Yes case of step 180), step 184 follows next, and it is checked whether dichromatic thermometer 26 is in normal condition. This check is executed by detecting the liquid surface temperature with dichromatic thermometer 26. If the detected temperature is different from the set liquid surface temperature (No case of step 184), an error message is output (step 186). If the detected temperature is equal to the set liquid surface temperature (Yes case of step 184), step 188 follows next and the position of quartz crucible 2 is set.

After termination of step 188, the liquid surface temperature is set (step 190). This setting is performed as described hereinafter.

First, the liquid surface temperature is detected by dichromatic thermometer 26, and the difference to the set liquid surface temperature is fed back to the power supply of heater 7 by controlling the SCR controller. However, the liquid surface temperature is input once in 0.5 seconds and by the calculation stated hereafter PID control is performed.

Liquid surface temperature $n =$ $((\Sigma$ liquid surface temperature/smoothing frequency) $\times$ (700/4095) + 900) + dead time compensation value;
Heater power = $-$ ($P$ const $\times$ (difference$n$ + $I$ const $\times$ $\Sigma$ ((difference $n-1$ + difference $n$)/2) $\times \Delta t + D$ const $\times$ ((difference $n$ $-$ difference $n-1$)/$\Delta t \times EXP(-t/$time const))) + bias;

whereby
difference n = liquid surface temperature n − set liquid surface temperature,
P const=(P const of set process parameter)/100,
I const = 10000/(I const of set process parameter),
D const=(D const of set process parameter)/10,
time const=(time const of set process parameter)/100
$\Delta t$=(sampling time of set process parameter)/100,
t=0~$\Delta t$ The calculation method for the dead time compensation value is shown hereafter.
F1,n=F1,n−1+(T$_S$/T)×(Cn−F1,n−1)
F2,n=F2,n−1+2×(T$_S$/L)×(F1,n−F2,n−1)
F3,n=F3,n−1+2×(T$_S$/L)×(F2,n−F3,n−1)
Cn:heater power n−bias T$_s$: (sampling time of set process parameter)/100
T:(process time constant of set process parameter)/100×60
L:(process dead time of set process parameter)/100×60
Dead time compensation value=A×(F1,n−F3,n)
A:process gain of set process parameter/100

Then, secondly, for detection recristallisation, an error message is output if the liquid surface temperature is below 1400° C.

Thirdly, it is confirmed and finally established that the liquid surface temperature lies within ±1° C. of the set liquid surface temperature and that the termination decision time is reached.

After finishing step 190, it is decided whether the switch of the seed process is on On (step 192), and if Yes, the seed process is put into action. If the answer is No, a termination message is output (step 194).

The liquid surface temperature before the seed process (process of dipping the seed crystal into molten liquid 6) is controlled to the set temperature as described hereinafter.

Since in this single crystal draw up process the dichromatic thermometer 26 is used for measuring the liquid surface temperature by taking the energy ratio of two waves having two wavelengths in the infrared and which are reflected from the molten liquid surface at the time of melting, the temperature of the molten liquid surface of the raw material melting, which is not influenced by external factors such as precipitation on the window, can be exactly measured. Therefore, by controlling the heating power in accordance with the difference between the measured temperature and the set temperature, there occurs no overheating by overshoot and molten liquid cannot evaporate excessively.

Moreover, since in this single crystal pulling process, due to aforementioned reasons, the temperature of the surface liquid can be accurately controlled and a single crystal of constant shape and quality may be manufactured.

Furthermore, since in this single crystal manufacturing method, the liquid surface temperature of the raw material melting and time can be accurately controlled, the timing for dipping the seed crystal into the molten liquid can be set on automatic, and the seed process can be automated.

Hereinafter, some more explanations are given on the method for deciding by simulation the liquid surface control parameters in preferred embodiment 4 to 6.

Fourth preferred embodiment

Figure 10:
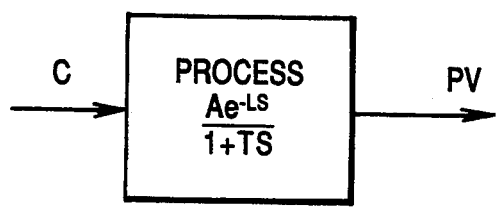
FIG. 10 is a block diagram for explaining the simulation method by dead time+first order delay process step response (PROC).

FIG. 10 shows the simulation method for dead time plus linear delay process step response (PROC).

When the process transmission function is set to $(A\, e^{-LS})/(1+TS)$ as indicated in FIG. 10 (whereby, A:process gain, L:process dead time, T:process time constant, S:process operator), process variable PV is calculated when control input C is input and output at the frequency/of the unit time.

The calculation is carried out according to the difference formulas stated hereafter, which replace the transmission function of the Laplace description.

Process
F1,n=F1,n−1+(T$_s$/T)×(Cn−F1,n−1)
F2,n=F2,n−1+2×(T$_s$/L)×(F1,n−F2,n−1)
F3,n=F3,n−1+2×(T$_s$/L)×(F2,n−F3,n−1)
PV=AF3,n
Here, T$_s$ is the sampling time.

Figure 13:
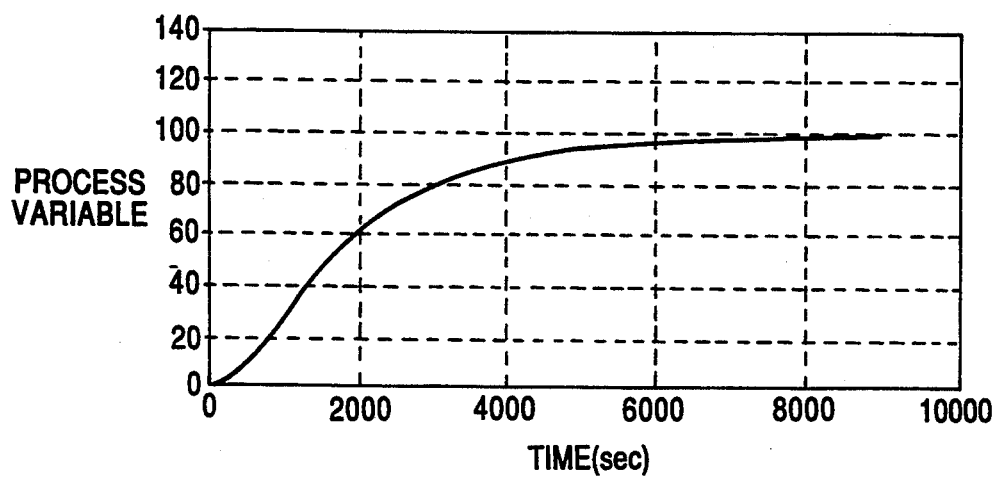
FIG. 13 is a graph showing the simulation effect by dead time+first order process step response (PROC).

In FIG. 13, the simulation result is shown for T$_S$=30 sec, L=600 sec, T=1500 sec, A=0.3.

As a result of this, the graph of the obtained time—process variable does not overshoot and reaches the setting time of the target value in approximately 100 min.

Fifth preferred embodiment

Figure 11:
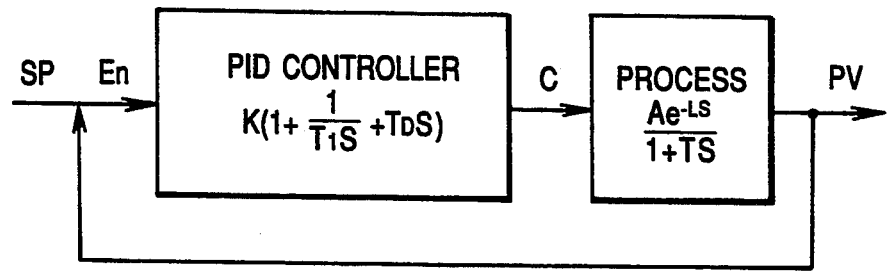
FIG. 11 is a block diagram for explaining the simulation method by dead time+first order delay process feed back simulation (FEED).

FIG. 11 shows the dead time+linear delay process feed back simulation (FEED) method. As shown in FIG. 11 the transmission function of the process is set to $(A\, e^{-LS})/(1+TS)$ and the transmission function of the PID control to $K(1+(1/T_IS)+T_DS)$ (whereby, K:comparison gain, T$_I$:integral time, T$_D$:differential time), and when the process variable (PV) is controlled by feed back so it equals the target value (SP), control input (C) and process variable (PV) are calculated and are repeatedly output after each unit time.

Calculation is performed by substituting the transfer function of the Laplace description with the difference form stated hereafter.
PID controller
EN=PV−SP $$Vn = (T_S/2) \times (En + En-1) + Vn-1$$
$$C = K((En + (VniT_I) + (T_D/T_S) \times (En - En-1))$$
process
$$F1,n = F1,n-1 + (T_S/T) \times (Cn - F1,n-1)$$
$$F2,n = F2,n1 + 2 \times (T_S/L) \times (F1,n - F2,n-1)$$
$$F3,n = F3,n-1 + 2 \times (T_S/L) \times (F2,n - F3,n-1)$$
$$PV = AF3,n$$

Figure 14:
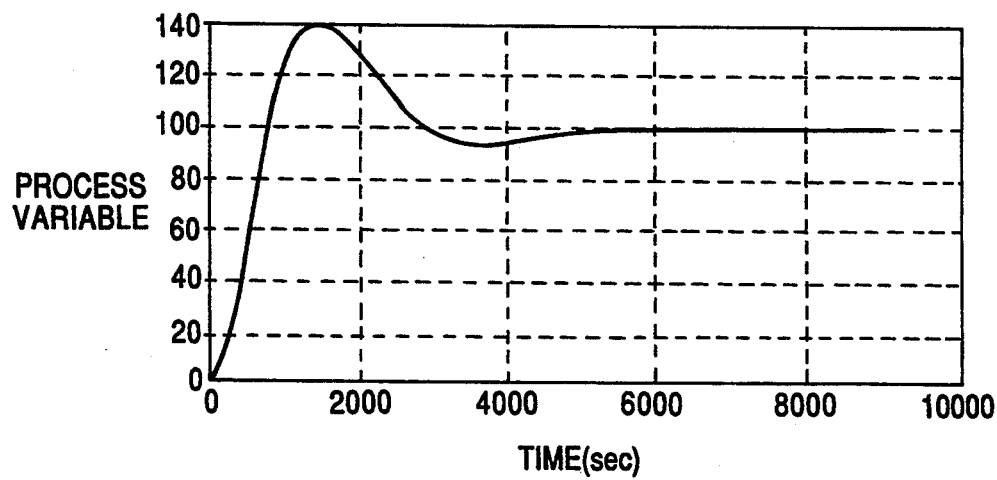
FIG. 14 is a graph showing the simulation effect by dead time+first order delay process feed back simulation (FEED)

If $K = -20$, $T_I = 714$ sec, $T_D = 360$ the simulation effect shown in FIG. 14 is obtained.

As a result of this, the graph of the obtained time and process variable confirms that the set time to the target value is approximately 80 minutes and though it is comparatively small to the one in the first preferred embodiment, there is an overshoot.

Sixth preferred embodiment

Figure 12:
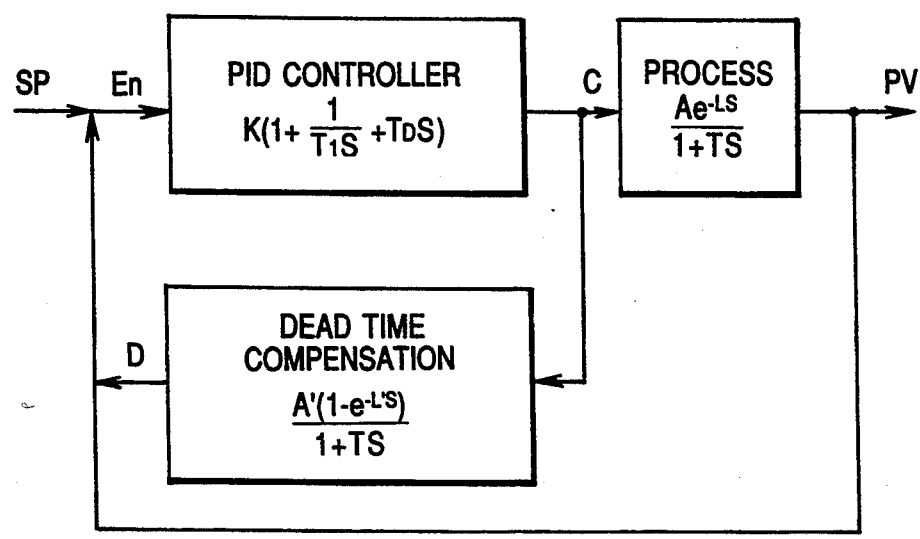
FIG. 12 is a block diagram for explaining the simulation method by dead time compensation feed back simulation (COMP).

FIG. 12 shows the dead time compensation feed back simulation (COMP).

When the transfer function of the process, as indicated in FIG. 12, is $$(A e^{-LS})/(1 + TS)$$

the transfer function of the PID controller is $$K(1 + (1/T_I S) + TDS)$$

and the transfer function of the dead time compensation is $$(A'(1 - e^{-L'S}))/(1 + T'S)$$

(for A': model process gain, L': model process dead time, T': model process time constant),
and when the process variable (PV) controlled by feed back such that it equals the target value (SP), control input (C) and the process variable (PV) are calculated and are repeatedly put out at each unit time.

The calculation is executed by substituting the transfer function of the Laplace description by the difference form stated hereafter.

PID controller
$$EN = PV + D - SP$$
$$Vn = (T_S/2) \times (En + En-1) + Vn-1$$
$$C = K((En + (Vn/T_I) + (T_D/T_S) \times (En - En-1))$$
process
$$F1,n = F1,n-1 + (T_S/T) \times (C - F1,n-1)$$
$$F2,n = F2,n-1 + 2 \times (T_S/L) \times (F1,n - F2,n-1)$$
$$F3,n = F3,n-1 + 2 \times (T_S/L) \times (F2,n - F3,n-1)$$
$$PV = AF3,n$$
dead time compensation
$$F'1,n = F'1,n-1 + (T_S/T') \times (C - F'1,n-1)$$
$$F'2,n = F'2,n-1 + 2 \times (T_S/L') \times (F'1,n - F'2,n-1)$$
$$F'3,n = F'3,n-1 + 2 \times (T_S/L') \times (F'2,n - F'3,n-1)$$
$$D = A'(F'1,n - F'3,n)$$

Figure 15:
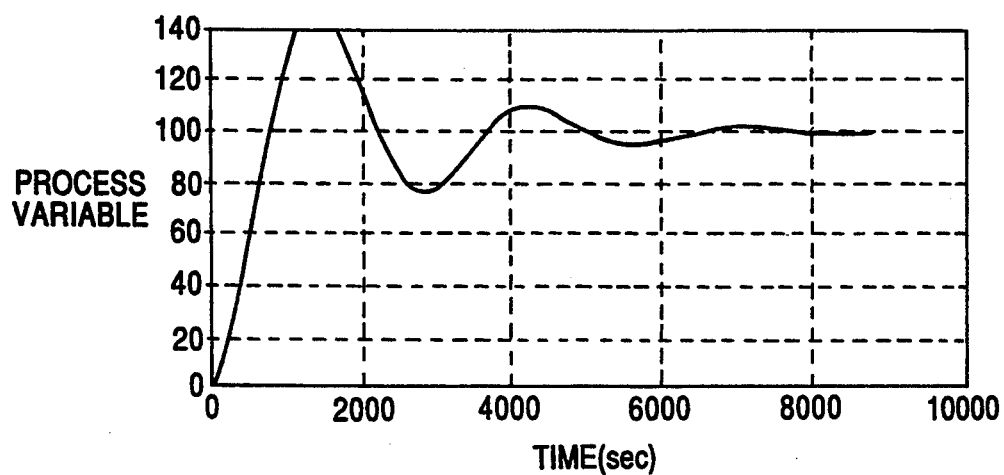
FIG. 15 is a graph showing the simulation effect by dead time compensation feed back simulation (COMP).

FIG. 15 shows the simulation results of the process variable for the case that $L' = 300$ sec, $T' = 900$ sec, $A' = 0.1$, $K = -20$, $T_I = 526$ sec, $TD = 150$ sec. Furthermore, FIG. 11 shows the simulation result of the process variables for the case that $L' = 600$ sec, $T' = 1500$ sec, $A' = 0.3$, $K = -50$, $T_I = 400$ sec, $T_D = 10$ sec.

Figure 16:
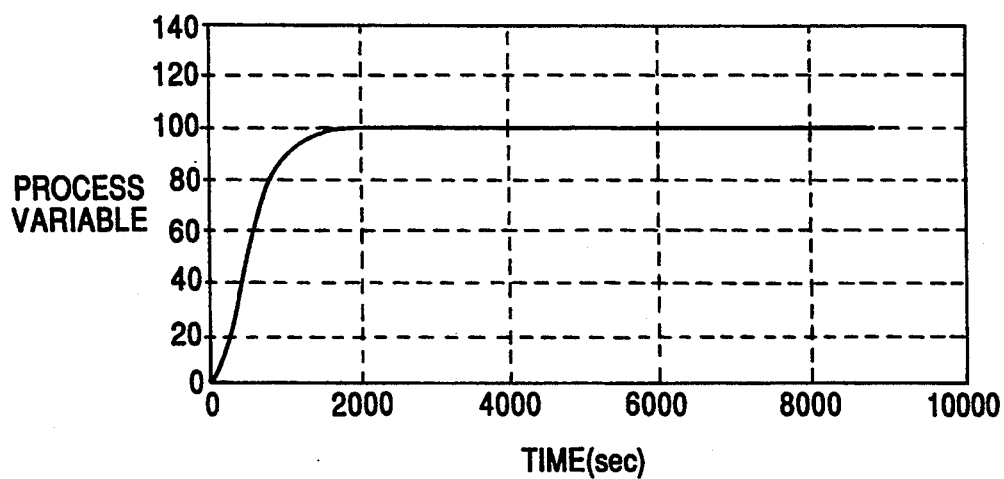
FIG. 16 is a graph showing the simulation effect by the same dead time compensation feed back simulation (COMP).

Though a change of the process variable could be seen in the result displayed in FIG. 15, in the result displayed in FIG. 16 there is no overshoot and in approximately 30 minutes a saturation result at the set value can be achieved.

Seventh preferred embodiment

A temperature set experiment was performed by using the single crystal draw up apparatus explained in the third preferred embodiment, a charge amount of 40 kg, a crucible revolution speed of 5 rpm and by using the parameters obtained from the simulation results of FIG. 16. As a result of this, as the heater power was limited to the range of 0—100 KW, the time until the set value was reached was 69 minutes and therefore longer than the simulation result in FIG. 15. However, it was possible to obtain a result which does not overshoot.

Eighth preferred embodiment

Figure 17:
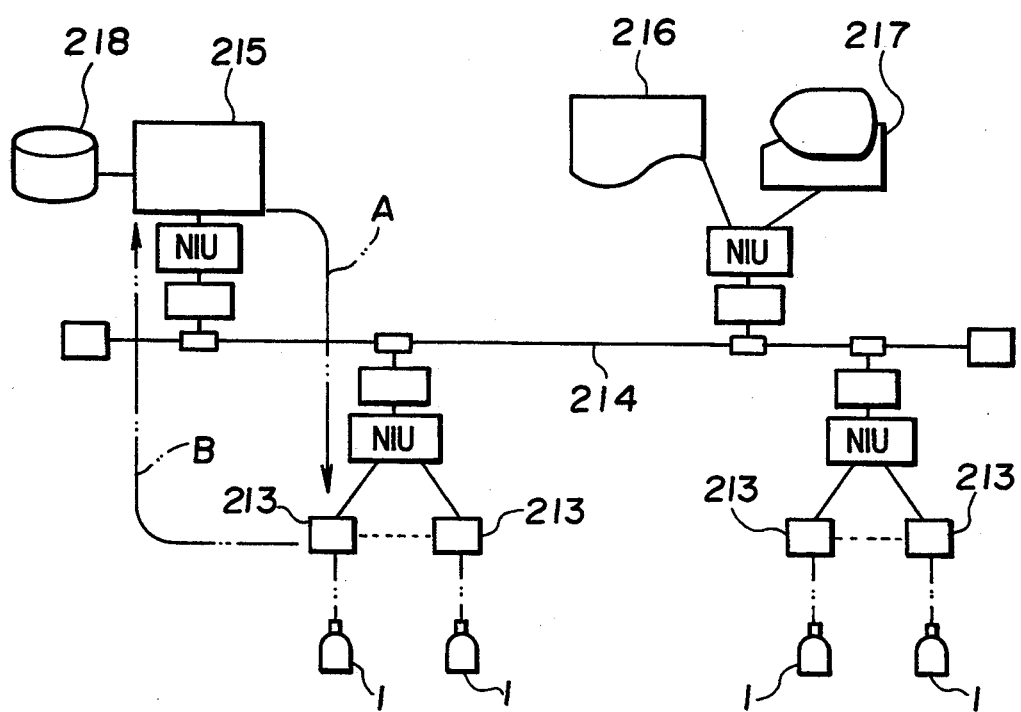
FIG. 17 is a schematic construction diagram showing the operation condition supervising system of the equipment implementation of the first preferred embodiment of the single crystal growth method from claim 7.
Figure 18:
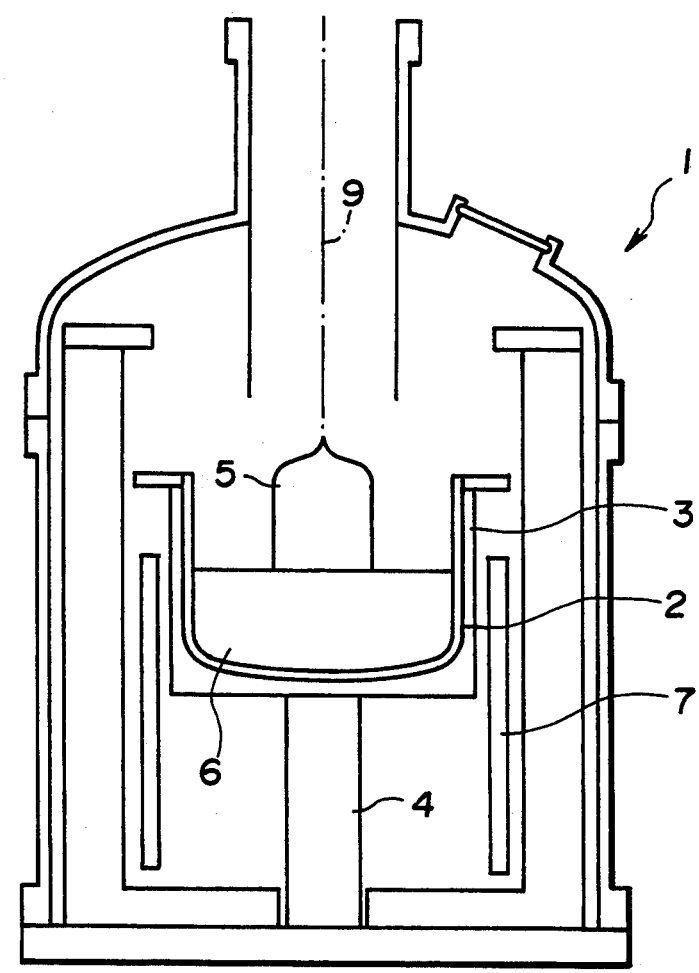
FIG. 18 is a cross section drawing showing the pulling apparatus main body comprising the equipment implementing the first preferred embodiment of the single crystal growth method of claim 7.

FIG. 17 and FIG. 18 show an example of an apparatus realizing the silicon single crystal growth method according to the preferred invention. This apparatus of FIG. 18 is a simplification of the draw up apparatus shown in the first and third preferred embodiment. In this apparatus, a quartz crucible 2 is provided in the approximate central part of furnace main body 1. This quartz crucible 2 is installed via graphite susceptor 3 on a lower axis 4 which can move freely up and down and can also rotate freely. In the surrounding of quartz crucible 2, heater 7 is provided for controlling the temperature of silicon molten liquid 6 in the inside of quartz crucible 2. Wire 9, which holds and draws up seed crystal 5, hangs over quartz crucible 2, can freely move up and down and also rotate freely. When silicon single crystal 5 is pulling in furnace main body 1, first the air inside furnace main body 1 is sufficiently replaced with argon gas; the raw material which was put beforehand quartz in crucible 2 is melted by means of heater 7, then wire 9 is lowered, so that the seed crystal dips in dissolved silicon molten liquid 6, then quartz crucible 2 and the seed crystal are caused to rotate in opposite directions while wire 9 is lifted up and causes single crystal 5 to grow.

To this furnace main body 1, as shown in FIG. 17, the pulling machine microcomputers 213 of the operation state observation system are respectively connected. To this pulling machine microcomputers 213, the sensor of the mechanism driving wire 9 of furnace main body 1, the sensor of the mechanism driving crucible 2, heater 7, the thermometer inside the crucible—not shown in the figure—, the barometer inside the crucible, the argon flux meter and all the other sensors for detecting conditions during the single crystal draw up are connected. Furthermore, the mechanism automatically detecting the starting times of all pull treating processes run in furnace main body 1 are connected to this pulling machine microcomputer 213. The data sent to this microcomputer 213 are stored temporarily in this microcomputer 213. The microcomputer 213 is connected to minicomputer 215 via communication circuit 214. The data stored in microcomputer 213 are sent to minicomputer 215 via communication circuit 214. Minicomputer 215 is connected via aforementioned communication circuit 214 with printer 216, which outputs draw up error messages, and with terminal 217 displaying the received data. Minicomputer 215 is connected to optomagnetic disk 218 storing the received data.

Figure 19:
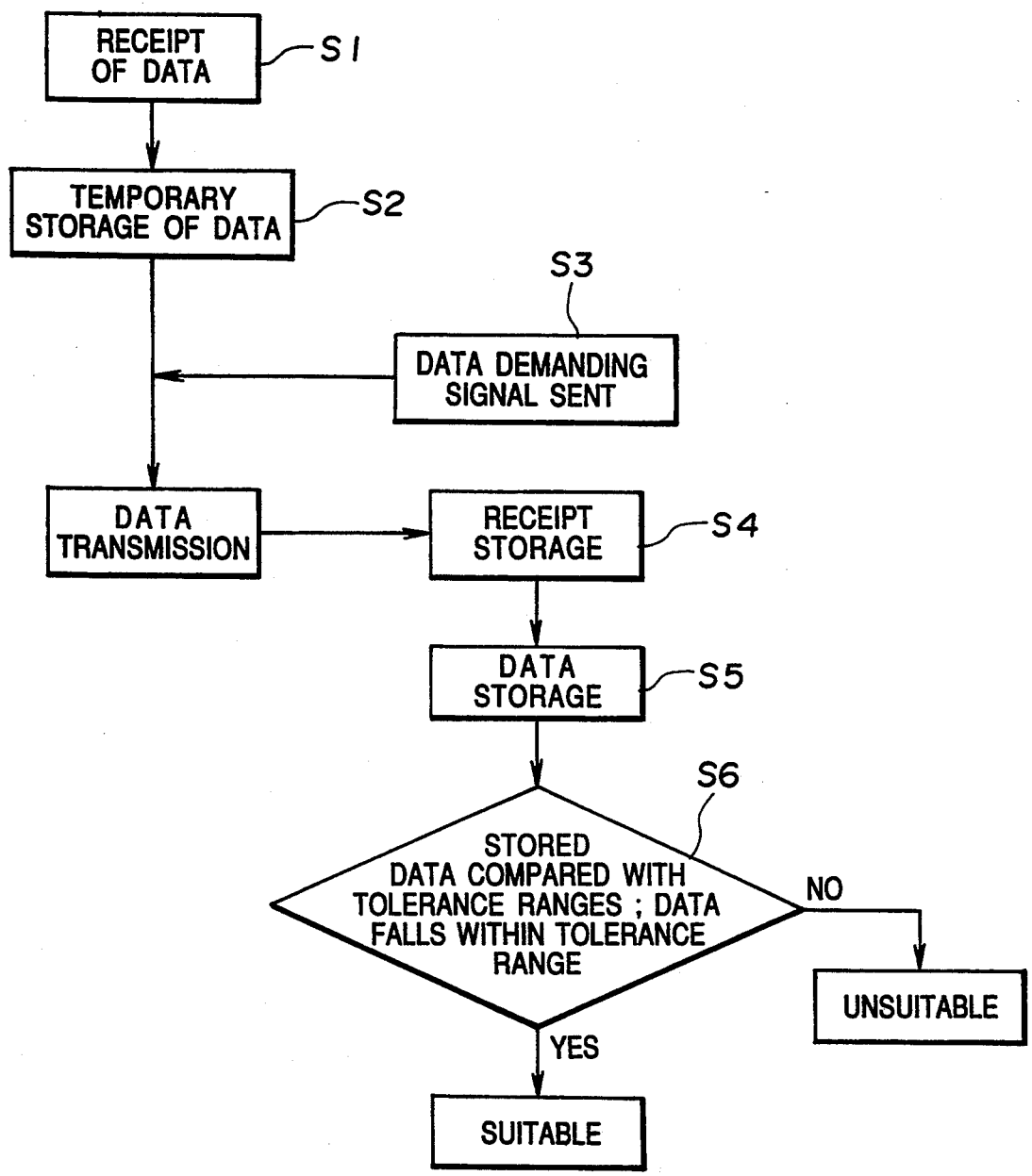
FIG. 19 is a flow chart showing the first preferred embodiment of the single crystal growth method of the present invention.

Now the first preferred embodiment for the silicon growth method of the present invention performed by this apparatus is explained in accordance with the flowchart in FIG. 19. In the explanation following hereafter, Sn stands for n-th step in the flow-chart.

In this single crystal draw up process, the manufacturing of the single crystal is started, the survey data of the draw up conditions are shown in group A hereafter and were measured in a constant time interval by all sensors provided in furnace main body 1, and the starting time data of all processes during the pulling which are shown in group B hereafter, are sent to microcomputer 213. Furthermore, also such data as silicon charge amount inside the crucible at the beginning of the silicon melt process, the leak rate of the gas inside the crucible, the position of the crucible at the beginning of the shouldering process (position in the draw up direction) are sent to microcomputer 213 (S1).

Group A
 seed lifting speed
 crucible lifting speed
 seed revolution number
 crucible revolution number
 heater temperature
 inner pressure of furnace
 Argon gas flux
Group B
 vacuum process
 dissolution process
 seed process
 shouldering process
 cylindration process
 bottom process
 cooling process
 process of carrying out manual operations on the lifting and lowering of the seed and the crucible
 process of carrying out manual operations on the revolution of seed and crucible.

Aforementioned data are temporarily stored in every microcomputer 213 (S2). On the other hand, from minicomputer 215 a signal demanding data in a 10 min. interval is sent to each microcomputer 213 (S3), and accordingly from every microcomputer 213 aforementioned data are sent to minicomputer 215 (S4). These data are stored on optomagnetic disk 218 (S5).

Tolerance change ratio of all the parameters on the screen, shown as an example in FIG. 20, are input to minicomputer 215. At the time when it is decided whether or not all parts of the manufactured single crystals are suitable for shipping, aforementioned stored data are compared with these tolerance ranges and then it is decided whether or not they fall within the tolerance range (S6). If they do not fall within the tolerance range, these parts are declared unsuitable for shipping; if they fall within the tolerance range, these parts are declared suitable for shipping.

Figures 24, 25:
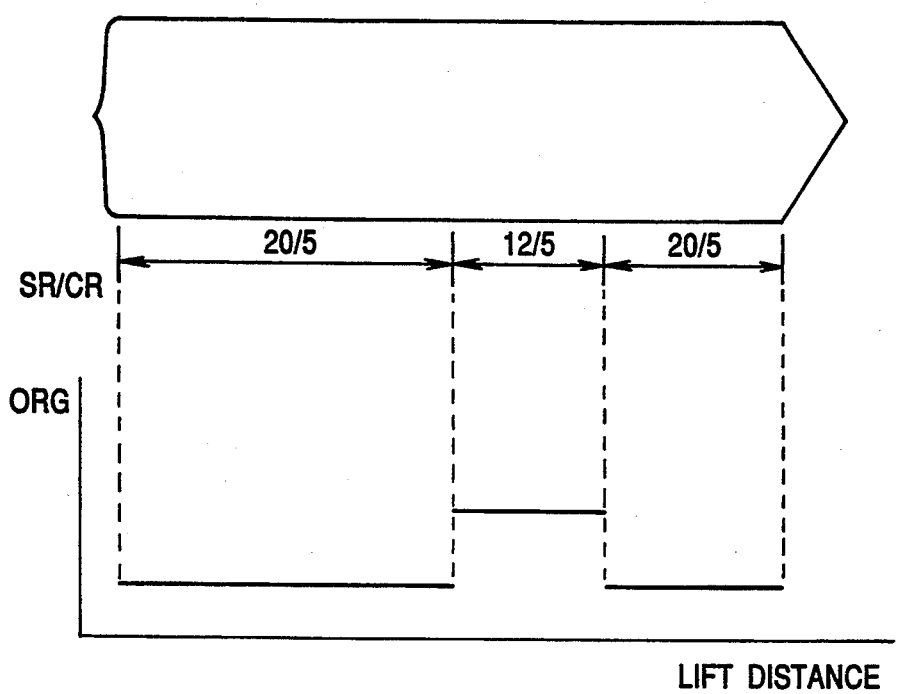
FIG. 24 is a schematic diagram for explaining the relation between the ratio of seed rotation frequency and crucible rotation frequency and ORG.
FIG. 25 is a figure from the output of the printer showing the parts for which the seed growth speed is out of tolerance.

On the other hand, it becomes possible to display graphically the data taken in for every obtained single crystal as shown in FIG. 21. The graphic example shows the relation between the seed lifting speed and the single crystal draw up length whereby the lines 220 and 221 indicate the upper and lower limit for the tolerance range of the seed lifting speed. The seed lifting speed is displayed whereby the data for a straight cylindrical part of the single crystal were processed for intervals of 10 mm. In other words, for every 10 mm drawn up part, maximum value, minimum value, average value, median and standard deviation of the seed lifting speed at the draw up is known and can be displayed. In this graph, D,E,F show those parts for which maximum values and minimum values fall out of the tolerance range. Such areas where the seed lifting speed falls out of the tolerance range can also be confirmed by an output of printer 216 as shown in FIG. 25.

According to this operation condition observation system, such things as starting time of each process during the single crystal draw up can be displayed and confirmed on terminal 217 as indicated in FIG. 22.

Since according to the single crystal growth method, the operation conditions during the single crystal manufacturing can automatically be detected, entry leaks and entry misses by the operator may be eliminated, and by computer processing the comparison between survey data and standard set values, it is possible to simultaneously get hold of those parts of the single crystal not meeting the standards, due to abnormal process conditions which did not remain in hitherto recordings once the draw up process was terminated.

Figure 23:
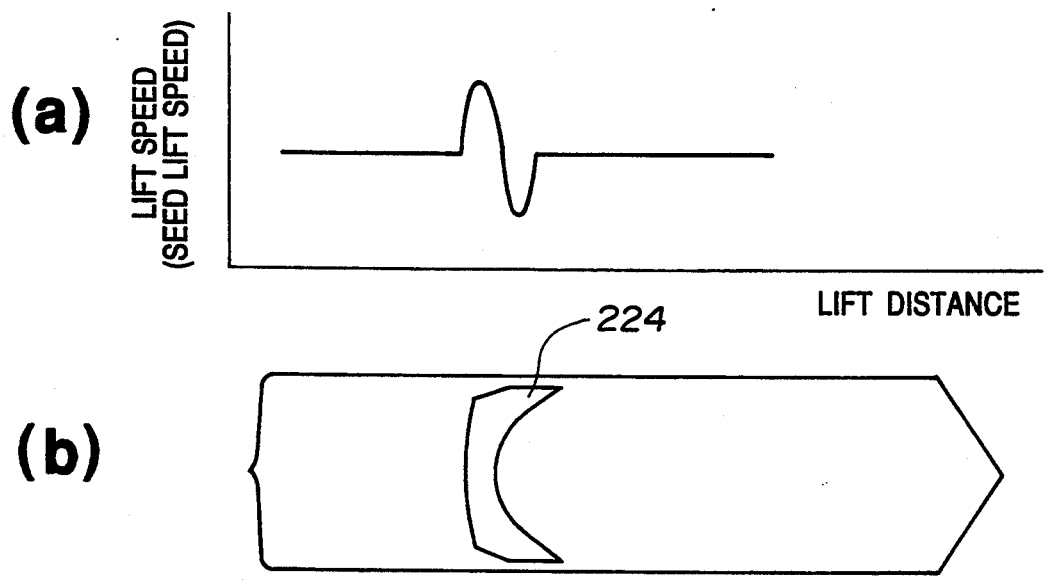
FIG. 23 is a schematic diagram for explaining the relation between pulling speed and formations of OSF occurrence regions.

If the pulling speed (seed lifting speed) showed abnormalities as shown in, for example, FIG. 23 (a), the formation of QSF occurrence regions 224 in the single crystal, as indicated in FIG. 23 (b) can be detected. When the ratio of seed revolution number (SR) and crucible rotation number (OR) show abnormal values, it can be seen that the inplane distribution ratio of the oxygen density ((center part oxygen density—surrounding part oxygen density)/central part oxygen density; hereinafter called ORG) in this part, as indicated in FIG. 24, falls outside the tolerance range.

Then, the parts not meeting the conditions of the slicing process which follows the pulling process, are immediately excluded and in the following process unsuitable parts may be prevented from being delivered. According to the single crystal growth method of this preferred embodiment, it is possible to precisely get hold of the crystal lot not meeting the manufacturing terms of the customer and portions which are not suitable, also reliability and stability of quality can be improved.

What is claimed is:
1. A single crystal growth method in which a silicon crystal is grown from molten silicon liquid in accordance with the Czochralski method wherein
 said silicon crystal is coaxially surrounded by a tube shaped heat shielding body which is tapered in downward direction,
 laserlight is caused to fall on the molten liquid surface through the inside of the tube shaped heat shielding body,
 the position of the molten liquid surface is measured by detecting reflected laserlight coming from the molten liquid surface,
 and the position of the molten liquid surface is controlled whereby
 the crucible is lifted at a constant speed if the position of the molten liquid surface is equal to the set value,
 the crucible lifting speed is set to be said constant speed diminished by a fixed ratio if the position of the molten liquid surface is higher than the set value,
 the crucible lifting speed is set to said constant speed increased by a fixed ratio if the position of the molten liquid surface is lower than the set value whereby,
 when a temperature of the liquid surface of the single crystal raw material is controlled,
 the liquid surface temperature is measured by taking an energy ratio of two waves having different wavelengths in the infrared and said two waves are emitted surface,
 and the liquid surface temperature is controlled whereby
 a heater power is regulated according to the difference to set temperature value.
2. A single crystal growth method according to claim 1 whereby a right value of a control parameter related to a control of the liquid surface control, is determined beforehand by simulation and a value of said parameter is used to control the liquid surface temperature.

3. A single crystal growth method according to claim 2 whereby aforementioned data related to the pulling conditions consist of data of conditions listed hereafter in group A, the silicon charge amount inside the crucible at the silicon melting process starting time, a leak rate of gas in the furnace, the position in pulling direction of the crucible at the shoulder process starting time of the single crystal, every process during said draw up process consists of processes listed in group B stated hereafter.

Group A
  seed lifting speed
  crucible lifting speed
  seed revolution number
  crucible revolution number
  heater temperature
  inner pressure of furnace
  argon gas flux
Group B
  vacuum process
  dissolution process
  seed process
  shouldering process
  cylindration process
  bottom process
  cooling process
process of carrying out manual operations on the lifting and lowering of the seed and the crucible process of carrying out manual operations on the revolution of seed and crucible.

4. The method according to claim 1 whereby,
  data related to pulling conditions are detected and stored during a draw up process,
  starting time of each process during the pulling process is detected and stored,
  said detected and stored data are compared in a comparison process with a tolerance range of these data stored beforehand,
  such that by outputting the data falling outside the tolerance range as draw up mismatch information, it becomes possible to detect after draw up termination parts in the single crystal not complying with the pulling conditions,
  and all pulled data are stored.

5. A single crystal growth method whereby in the silicon single crystal growth method
  a silicon single crystal is caused to grow from a silicon molten liquid which was put into a crucible according to the Czochralski method,
  data related to pulling conditions are detected and stored during a draw up process,
  starting time of each process during the pulling process is detected and stored,
  said detected and stored data are compared in a comparison process with a tolerance range of these data stored beforehand,
  by outputting the data falling outside the tolerance range as draw up mismatch information, it becomes possible to detect after draw up termination parts in the single crystal not complying with the pulling conditions,
  and all pulled data are stored.

* * * * *